United States Patent
Mehandru et al.

(10) Patent No.: US 11,282,930 B2
(45) Date of Patent: Mar. 22, 2022

(54) CONTACT ARCHITECTURE FOR CAPACITANCE REDUCTION AND SATISFACTORY CONTACT RESISTANCE

(71) Applicant: Intel Corporation, Santa Clara, CA (US)

(72) Inventors: Rishabh Mehandru, Portland, OR (US); Pratik A. Patel, Portland, OR (US); Thomas T. Troeger, Portland, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/085,857

(22) Filed: Oct. 30, 2020

(65) Prior Publication Data

US 2021/0050423 A1    Feb. 18, 2021

Related U.S. Application Data

(63) Continuation of application No. 16/465,489, filed as application No. PCT/US2016/069513 on Dec. 30, 2016, now Pat. No. 10,872,960.

(51) Int. Cl.
*H01L 29/417* (2006.01)
*H01L 21/02* (2006.01)
(Continued)

(52) U.S. Cl.
CPC ...... *H01L 29/4175* (2013.01); *H01L 21/0262* (2013.01); *H01L 21/02576* (2013.01);
(Continued)

(58) Field of Classification Search
CPC .......... H01L 29/4175; H01L 21/02576; H01L 21/02579; H01L 21/0262; H01L 21/26513;
(Continued)

(56) References Cited

U.S. PATENT DOCUMENTS

2007/0181954 A1    8/2007    Oikawa et al.
2012/0280251 A1    11/2012   Dube et al.
(Continued)

OTHER PUBLICATIONS

Extended European Search Report from European Patent Application No. 16925191.5 dated Jul. 23, 2020, 8 pgs.
(Continued)

*Primary Examiner* — Karen Kusumakar
(74) *Attorney, Agent, or Firm* — Schwabe, Williamson & Wyatt, P.C.

(57) ABSTRACT

Solid assemblies having a composite dielectric spacer and processes for fabricating the solid assemblies are provided. The composite dielectric spacer can include, in some embodiments, a first dielectric layer and a second dielectric layer having a mutual interface. The composite dielectric spacer can separate a contact member from a conductive interconnect member, thus reducing the capacitance between such members with respect to solid assemblies that include one of first dielectric layer or the second dielectric layer. The composite dielectric spacer can permit maintaining the real estate of an interface between the conductive interconnect and a trench contact member that has an interface with a carrier-doped epitaxial layer embodying or constituting a source contact region or a drain contact region of a field effect transistor. The trench contact member can form another interface with the conductive interconnect member, providing a satisfactory contact resistance therebetween.

20 Claims, 11 Drawing Sheets

(51) Int. Cl.
*H01L 21/265* (2006.01)
*H01L 21/306* (2006.01)
*H01L 21/321* (2006.01)
*H01L 29/08* (2006.01)
*H01L 29/40* (2006.01)
*H01L 29/45* (2006.01)
*H01L 29/49* (2006.01)
*H01L 29/66* (2006.01)

(52) U.S. Cl.
CPC .. *H01L 21/02579* (2013.01); *H01L 21/26513* (2013.01); *H01L 21/30604* (2013.01); *H01L 21/32115* (2013.01); *H01L 29/0847* (2013.01); *H01L 29/401* (2013.01); *H01L 29/45* (2013.01); *H01L 29/4991* (2013.01); *H01L 29/665* (2013.01); *H01L 29/6656* (2013.01)

(58) Field of Classification Search
CPC ......... H01L 21/30604; H01L 21/32115; H01L 29/0847; H01L 29/401; H01L 29/45; H01L 29/4991; H01L 29/665; H01L 29/6656; H01L 21/76805; H01L 21/76831; H01L 29/78; H01L 21/28518; H01L 21/76897; H01L 21/76883
See application file for complete search history.

(56) References Cited

U.S. PATENT DOCUMENTS

| | | |
|---|---|---|
| 2013/0137257 A1 | 5/2013 | Wei et al. |
| 2013/0320452 A1 | 12/2013 | Wann et al. |
| 2015/0048417 A1 | 2/2015 | Kwok et al. |
| 2015/0206872 A1 | 7/2015 | Hsu et al. |
| 2016/0086950 A1 | 3/2016 | Eom et al. |
| 2016/0087104 A1 | 3/2016 | Lee et al. |
| 2016/0233164 A1 | 8/2016 | Choi |
| 2018/0174904 A1* | 6/2018 | Hsieh .................... H01L 29/785 |

OTHER PUBLICATIONS

Internationals Search Report and Written Opinion for International Patent Application No. PCT/US2016/069513 dated Sep. 27, 2017, 13 pgs.

Internationals Preliminary Report on Patentability for International Patent Application No. PCT/US2016/069513 dated Jul. 11, 2019, 9 pgs.

Extended European Search Report from European Patent Application No. 21188335.0 dated Oct. 20, 2021, 9 pgs.

* cited by examiner

CONTACT ARCHITECTURE FOR CAPACITANCE REDUCTION AND SATISFACTORY CONTACT RESISTANCE

CROSS-REFERENCE TO RELATED APPLICATION

This patent application is a continuation of U.S. patent application Ser. No. 16/465,489, filed May 30, 2019, which is a U.S. National Phase Application under 35 U.S.C. § 371 of International Application No. PCT/US2016/069513, filed Dec. 30, 2016, entitled "CONTACT ARCHITECTURE FOR CAPACITANCE REDUCTION AND SATISFACTORY CONTACT RESISTANCE," which designates the United States of America, the entire disclosure of which are hereby incorporated by reference in their entirety and for all purposes.

BACKGROUND

Miniaturized solid-state transistors leverage low contact resistance to output high on-current. However, as miniaturization continues, and transistor dimensions are further reduced, capacitance between contact via and gate metal increases. Such capacitance is undesirable and detrimental to the operation of a transistor. As such, much remains to be improved in the reduction of parasitic capacitance in miniaturized solid-state transistors.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

FIG. 2A illustrates a schematic cross-sectional view of an example a solid structure in accordance with one or more embodiments of the disclosure;

FIG. 2B illustrates a schematic cross-sectional view of an example of another solid structure resulting from treating the solid structure shown in FIG. 2A, in accordance with one or more embodiments of the disclosure;

FIG. 2C illustrates a schematic cross-sectional view of an example of another solid structure resulting from treating the solid structure shown in FIG. 2B, in accordance with one or more embodiments of the disclosure;

FIG. 2D illustrates a schematic cross-sectional view of an example of another solid structure resulting from treating the solid structure shown in FIG. 2C, in accordance with one or more embodiments of the disclosure;

FIG. 2E illustrates a schematic cross-sectional view of an example of another solid structure resulting from treating the solid structure shown in FIG. 2D, in accordance with one or more embodiments of the disclosure;

FIG. 2F illustrates a schematic cross-sectional view of an example of another solid structure resulting from treating the solid structure shown in FIG. 2E, in accordance with one or more embodiments of the disclosure;

FIG. 2G illustrates a schematic cross-sectional view of an example of another solid structure resulting from treating the solid structure shown in FIG. 2F, in accordance with one or more embodiments of the disclosure;

FIG. 2H illustrates a schematic cross-sectional view of an example of another solid structure resulting from treating the solid structure shown in FIG. 2I, in accordance with one or more embodiments of the disclosure; and FIG. 2I illustrates a schematic cross-sectional view of an example of the semiconductor device formed according to the example process, in accordance with one or more embodiments of the disclosure.

FIG. 3A illustrates an example of a solid structure including a recess that can be leveraged to form the doped epitaxial layer, in accordance with one or more embodiments of the disclosure; and FIG. 3B illustrates an example of another solid structure resulting from treating the solid structure shown in FIG. 3A, in accordance with one or more embodiments of the disclosure.

FIG. 4A illustrates an example of a solid structure including carrier-doped regions, in accordance with one or more embodiments of the disclosure; and FIG. 4B illustrates an example of another solid structure resulting from treating the solid structure shown in FIG. 4A, in accordance with one or more embodiments of the disclosure.

FIG. 5A illustrates an example of a solid structure including carrier-doped regions and conductive interconnect members, in accordance with one or more embodiments of the disclosure; and FIG. 5B illustrates an example of another solid structure resulting from treating the solid structure shown in FIG. 5A, in accordance with one or more embodiments of the disclosure.

DETAILED DESCRIPTION

Figure 1:
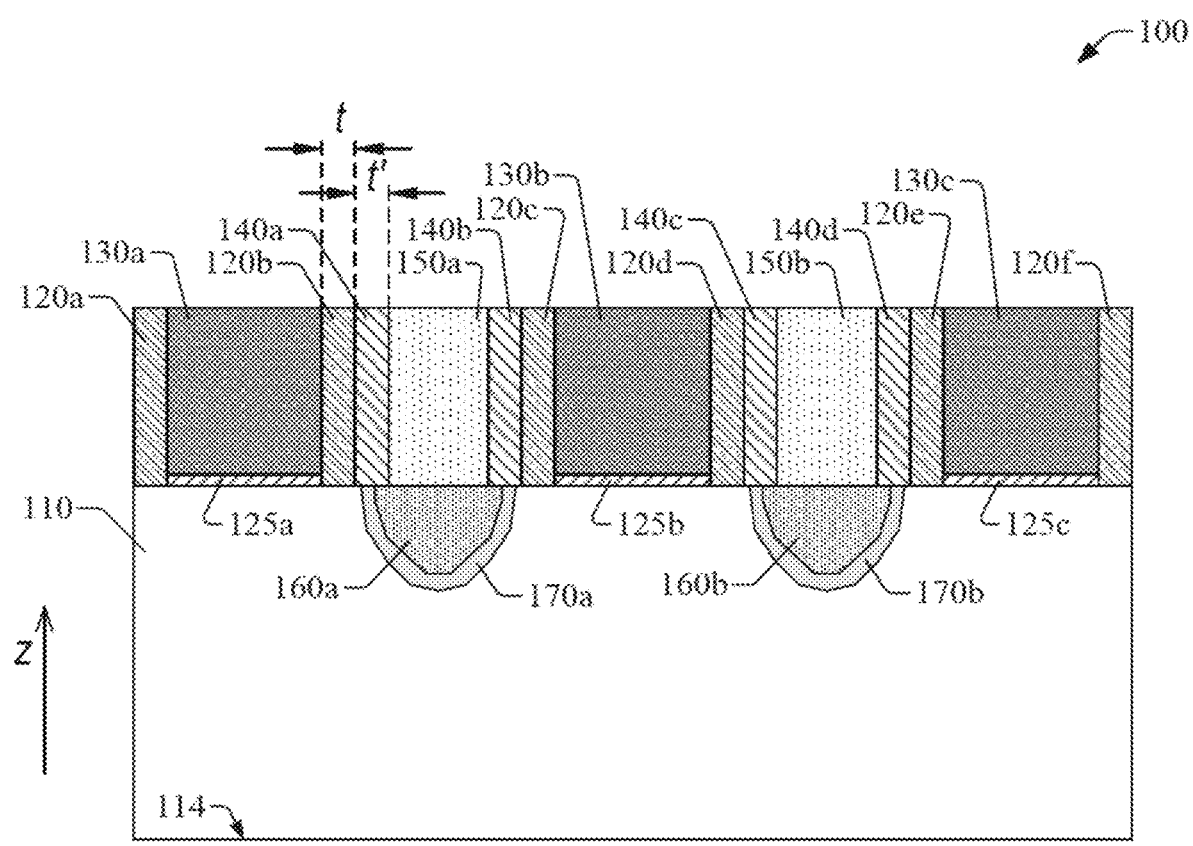
FIG. 1 illustrates a cross-sectional view of an example of a semiconductor device in accordance with one or more embodiments of the disclosure.

The present disclosure recognizes and addresses, in at least some embodiments, the issue of parasitic capacitance in highly miniaturized (scaled-down) solid state transistors. Such transistors can rely on low contact resistance to provide high on-current, which can be achieved by forming, for example, a deep trench contact having a large contact area with a contact via, which can provide a desirable contact resistance. As the transistor dimensions are scaled down, the formation of trench contacts can yield parasitic capacitances between the via contact and a gate contact. Embodiments of the disclosure can provide solid assemblies having a composite dielectric spacer separating a contact member from a conductive interconnect. Other embodiments can provide processes for fabricating the solid assemblies. In some embodiments, a solid assembly can constitute or can include a field effect transistor having carrier-doped epitaxial layers forming, respectively, a source contact and a drain contact, where the carrier-doped epitaxial layers are embedded in a semiconductor substrate. In one example, the solid assemblies in accordance with embodiments of this disclosure can constitute or can include a planar field effect transistor (FET). In another example, the solid assemblies in accordance with embodiments of this disclosure can constitute or can include a non-planar FET. In some embodiments, the carrier-doped epitaxial layers can form an interface with respective trench contact members. The trench contact members form interfaces with respective conductive interconnects extending from the interface along a stacking direction, where the interfaces can provide a desirable contact resistance. A first conductive interconnect forms an interface with a first dielectric layer extending, along the stacking direction, from the interface between the first conductive interconnect and a first trench contact member. The first dielectric layer forms an interface with a second dielectric layer, along the stacking direction. The second dielectric layer is adjacent to the first dielectric layer and also forms an interface with a contact member, along the stacking direction. The contact member also can form another interface with a dielectric layer formed on a surface of the semiconductor substrate. Thus, the dielectric layer can extend from the surface of the semiconductor substrate along the stacking direction, spanning a defined thickness. In addition, the contact member can extend from the interface between the contact member and the dielectric layer, along the stacking direction. In some embodiments, the contact member and the dielectric layer can serve, respectively, as a gate contact and a gate dielectric layer. The first dielectric layer and the second dielectric layer form a composite dielectric spacer that can contain the capacitance between the conductive interconnect and the gate contact to a satisfactory magnitude, while maintaining the desirable contact resistance. In at least some embodiments, reductions of about 3%/nm to about 6%/nm in parasitic capacitance can be achieved for each nanometer of the second dielectric layer for at least the first few nanometers (e.g., from about 1 nm to about 5 nm).

While some embodiments of the solid assemblies in accordance with aspects of the disclosure are illustrated in connection with planar field effect transistors (FETs), the disclosure is not so limited and, in some embodiments, the solid assemblies in accordance with this disclosure can constitute or can include a non-planar FET, including multi-gate FETs, such as a fin field effect transistor (FinFET), tri-gate FET, dual-gate FET. In some embodiments, the non-planar FET can include contact members (e.g., a source contact member and/or a drain contact member) embodied in a nanowire (e.g., a solid structure elongated along a first direction and having an extent confined to a few nanometers (e.g., about 1 nm to about 10 nm) in other directions substantially perpendicular to first direction.

Embodiments of this disclosure can provide several advantages over conventional designs and fabrication of solid assemblies that include field effect transistors or other types of semiconductor devices in integrated circuitry. In one example, rather than either lowering parasitic capacitances or achieving desirable contact resistances, embodiments of the disclosure can permit or otherwise facilitate lowering a parasitic capacitance between a gate contact and a conductive interconnect in contact with a source region or a drain region and concurrently maintaining a satisfactory contact resistance, and thus, such embodiments can permit mitigating or avoiding performance degradation for on-state resistance.

With reference to the drawings, FIG. 1 illustrates a schematic cross-sectional view of an example of a semiconductor device 100 in accordance with one or more embodiments of the disclosure. The semiconductor device 100 can embody or can include a transistor. Specifically, as illustrated, the semiconductor device 100 can include a semiconductor substrate 110 having a first surface 114 and a second surface opposite to the first surface 114. The semiconductor substrate 110 can be formed from or can include, for example, an intrinsic semiconductor (e.g., Si, Ge), a doped semiconductor (e.g., p-type Si, n-type Si, p-type Ge, n-type Ge, and the like) or a semiconductor compound (e.g., a III-V semiconductor, a II-VI semiconductor, or a Si—Ge alloy). In some embodiments the semiconductor substrate 110 can be crystalline and oriented along a defined crystallographic direction, such as [001] or [311], defining a stacking direction z. A group of contact members, including contact member 130a, contact member 130b, and contact member 130c, can be placed on the semiconductor substrate 110. At least one contact member in the group of contact members can serve, in some embodiments, as a gate contact in a transistor included in the semiconductor device 100. In one example, the contact member 130b can embody such a gate contact. In addition, the semiconductor device 100 can include a group of first dielectric layers, including dielectric layer 125a, dielectric layer 125b, and dielectric layer 125c. Each (or, in some embodiments, at least one) dielectric layer in the group of first dielectric layers can be formed from, or can include, a dielectric material. In some embodiments, such a dielectric material can include a silicon oxide or another high-K material; a combination of the foregoing; or the like. High-K dielectric materials can include, for example, alumina; silicon monoxide (SiO, K of about 5.0); silicon dioxide ($SiO_2$, K of about 3.9); titanium dioxide; silicon nitride ($SiO_3N_4$, K of about 6); boron nitride (BN, K of about 4.5); alkali halides (such as rubidium bromide (RbBr, K of about 4.7), lithium fluoride (LiF, K of about 9.2), barium titanate ($BaTiO_3$, K varies from about 130 to about 1000), lead titanate ($PbTiO_3$, K ranges between about 200 to about 400); and metal oxides (e.g., hafnium dioxide ($HfO_2$, K of about 40), tantalum oxide ($TaO_5$, K of about 27), tungsten oxide ($WO_3$, K of about 42) and zirconium dioxide ($ZrO_2$, K of about 24.7). Other high-K materials can include, for example, $La_2O_3$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, SiN, a silicate thereof, or an alloy thereof. At least one dielectric layer in the group of first dielectric layers can serve, in some embodiments, as a gate dielectric. In some embodiments, each of the group of first dielectric layers can be in contact or otherwise form an interface with a respective one of the group of contact members.

Each of the contact members 130a-130c can form an interface with, or otherwise can abut, a respective portion of the second surface opposite to the first surface 114, and can extend from the interface to an end surface, along the z-direction. As such, each of the contact members 130a-130b can have a first side surface and a second side surface opposite to the first side surface. Each of the first side surface and the second side surface can be perpendicular to the second surface opposite to the first surface 114.

The semiconductor device 100 can include a group of second dielectric layers, each having a defined thickness t (a real number in units of length) and formed from a dielectric material of a first type. In some embodiments, such a dielectric material can include a silicon oxide or another high-K material; a combination of the foregoing; or the like. High-K dielectric materials can include, for example, alumina; SiO; $SiO_2$; titanium dioxide; $SiO_3N_4$; BN; alkali halides (such as RbBr, LiF, $BaTiO_3$, $PbTiO_3$; and metal oxides (e.g., $HfO_2$, $TaO_5$, $WO_3$, and $ZrO_2$. Other high-K materials can include, for example, $La_2O_3$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, SiN, a silicate thereof, or an alloy thereof.

The defined thickness t can range from about one atomic monolayer (ML) to several MLs—e.g., a range from about 0.5 nm to about 10 nm, depending on the dielectric material that forms the dielectric layers in the group of second dielectric layers. Each (or, in some embodiments, at least one) of the group of second dielectric layers can be in contact with or otherwise can abut a contact member of the group of contact members. As illustrated, the group of second dielectric layers includes dielectric layer 120a, dielectric layer 120b, dielectric layer 120c, dielectric layer 120d, dielectric layer 120e, and dielectric spacer layer 120f. In one example, the dielectric layer 120b can be in contact with the contact member 130a, and the dielectric layer 120c can be in contact with the contact member 130b. More specifically, a side surface of the dielectric layer 120b can be in contact with a side surface of the contact member 130a, and a side surface of the dielectric layer 120c can be in contact with a side surface of the contact member 130b.

In addition, the semiconductor device 100 can include a group of third dielectric layers, each having a defined thickness t' (a real number in units of length) and formed from a dielectric material of a second type different from the first type of dielectric material that forms the dielectric layer in the group of second dielectric layers. In some embodiments, such a dielectric material can include silicon dioxide, silicon nitride, or other types of low-k dielectrics, such as diamond like carbon (DLC); fluorinated DLC; parylene-N; parylene-F; a carbon doped oxide; a fluorine doped oxide; carbon doped silicon nitride; an organo silicate glass; a halogen doped nitride; or the like. In other embodiments, a dielectric layer of the group of third dielectric layers can be embodied in or can include an air gap.

The defined thickness t' can range from about one atomic monolayer (ML) to several MLs—e.g., a range from about 0.5 nm to about 10 nm, depending on the dielectric material that forms the third dielectric layers. Each (or, in some embodiments, at least one) of the group of third dielectric layers can be in contact with or otherwise can abut a dielectric layer of the group of second dielectric layers. As illustrated in FIG. 1, the group of third dielectric layers includes dielectric layer 140a, dielectric layer 140b, dielectric layer 140c, and dielectric layer 140d. In one example, the dielectric layer 140a can be in contact with the dielectric layer 120b, and the dielectric layer 140b can be in contact with the dielectric layer 120c. More specifically, a side surface of the dielectric layer 140a can be in contact with a side surface of the dielectric layer 120b, and a side surface of the dielectric layer 140b can be in contact with a side surface of the dielectric layer 120c.

The semiconductor device 100 also can include conductive interconnects, such as metal vias, metal rods or columns, a combination thereof, or the like. At least one (or, in some embodiments, each) of the conductive interconnects can extend from a surface essentially aligned with the second surface opposite to the first surface 114 up to a defined distance along the z-direction. Without intending to be bound by phenomenology or modeling, a surface essentially aligned with another surface can be a surface that is registered with the other surface within the spatial resolution of a process utilized to form the surface on the semiconductor device 100. In addition, at least one of the conductive interconnects can be assembled between a pair of contact members of the group of contact members included in the semiconductor device 100, and can be in contact with two or more of the dielectric layers in the group of third dielectric layers. Therefore, in some aspects, a dielectric layer (e.g., dielectric layer 120b) of the group of second dielectric layers and another dielectric layer (e.g., dielectric layer 140a) of the group of third dielectric layers can form a composite spacer layer that separates a contact member of the group of contact members including contact member 130a, contact member 130b, and contact member 130c from a conductive interconnect included in the semiconductor device 100. For example, the dielectric layer 120b and the dielectric layer 140a can form the composite spacer layer having a thickness t'+t' across the z-direction. The composite layer can separate the contact member 130a from the conductive interconnect 150a. For another example, the dielectric layer 120c and the dielectric layer 140b can form another composite spacer layer also having a thickness t'+t' across the z-direction. Such a composite layer can separate the contact member 130b from the conductive interconnect 150a. The thickness t'+t' can range from about 1.0 nm to about 10.0 nm.

In some aspects, a contact member (e.g., contact member 130a) and a conductive interconnect (e.g., conductive interconnect 150a) separated by a composite spacer layer constituted by a first dielectric layer and a second dielectric layer are capacitively coupled. In one example, the first dielectric layer can be embodied in or can include one dielectric layer (e.g., dielectric layer 120b) of the group of second dielectric layers. In addition or in another example, the second dielectric layer can be embodied in or can include one dielectric layer (e.g., dielectric layer 140a) of the group of third dielectric layers. Without intending to be bound by phenomenology or modeling, the presence of the second dielectric layer can reduce the capacitance between the conductive interconnect and contact member by increasing the thickness of dielectric material between the conductive interconnect and the contact member. The capacitance also can be further reduced by forming the second dielectric layer from a dielectric material having a dielectric constant (K') less than another dielectric electric constant (K) of the other dielectric material that forms the first dielectric layer.

The group of contact members included in the semiconductor device 100 also can include a second type of contact members embedded in the semiconductor substrate 110. The second type of contract member can include contact member 160a and contact member 160b. At least one (or, in some embodiments, each) contact member of the second type of contact members can be in electrical contact with at least one respective conductive interconnect of the conductive interconnects included in the semiconductor device 100. More specifically, such contact member(s) can form an interface with the respective conductive interconnect(s). As illustrated in FIG. 1, the conductive interconnect 150a can form an interface with the contact member 160a, and the conductive interconnect 150b can form another interface with the contact member 160b. Accordingly, the conductive interconnect 150a and the conductive interconnect 150b can be in electrical contact with the contact member 160a and the contact member 160b, respectively.

The semiconductor device 100 also can include carrier-doped epitaxial layers that, in some embodiments, can constitute source regions or drain regions. As illustrated, the semiconductor device 100 can include a carrier-doped epitaxial layer 170a and a carrier-doped epitaxial layer 170b.

In common scenarios, the thickness of a first dielectric layer separating a first type of contact member from a conductive interconnect is usually increased in order to reduce capacitance. In sharp contrast, the presence of a second dielectric layer in a composite spacer layer that separates the first type of contact member from the conductive interconnect can permit maintaining the surface real estate of an interface between the conductive interconnect and a second type of conductive member embedded in the semiconductor substrate 110 while, as mentioned, reducing the capacitance between the first type of contact member and the conductive interconnect. Therefore, such a reduction in capacitance can be achieved while maintaining a desirable or otherwise satisfactory contact resistance between the second type of conductive member and the conductive interconnect. More specifically, as an illustration, a composite spacer layer constituted by the dielectric layer 120b and the dielectric layer 140a can permit reducing the capacitance between the contact member 130a and the conductive interconnect 150a, while maintaining a desirable or otherwise defined contact resistance between the conductive member 150a and the contact member 160a. As another illustration, another composite spacer layer constituted by the dielectric layer 120c and the dielectric layer 140b can permit reducing the capacitance between the contact member 130b and the conductive interconnect 150a, while still maintaining the desirable or otherwise defined contact resistance between the conductive member 150a and the contact member 160a.

As yet another illustration, yet another composite spacer layer constituted by the dielectric layer 120d and the dielectric layer 140c can permit reducing the capacitance between the contact member 130b and the conductive interconnect 150b, while still maintaining another desirable or otherwise defined contact resistance between the conductive member 150b and the contact member 160b. As a further illustration, a further composite spacer layer constituted by the dielectric layer 120e and the dielectric layer 140d can permit reducing the capacitance between the contact member 130c and the conductive interconnect 150b, while still maintaining the other desirable or otherwise defined contact resistance between the conductive member 150b and the contact member 160b.

While various elements of the semiconductor device 100 are illustrated as having sharp vertical interfaces that are perpendicular to the surface 114 of the semiconductor substrate 110, the disclosure is not limited in that respect. Some of the elements, including contact members and/or dielectric layers, can have interfaces or sidewalls that, in some embodiments, can form respective angles with the surface 114, another surface opposite to the surface 114, or another planar surface of the semiconductor substrate 110. In addition or in other instances, an element (e.g., a contact member or a dielectric layer) can include a sidewall that can have portions, at respective different positions along the z-direction, that can be form respective angles with the surface 114, another surface opposite to the surface 114, or another planar surface of the semiconductor substrate 110.

In addition, while a particular arrangement of the elements of the semiconductor device 100 is illustrated in accordance with embodiments of the disclosure directed at least to a planar planar FETs, the disclosure is not so limited and, in some embodiments, arrangements of the elements of the semiconductor device 100 or other devices can of this disclosure can embody or can include non-planar FETs, such as FinFETs, tri-gate FETs, dual-gate FETs, or other types of non-planar FETs having contact members (e.g., a source contact member and/or a drain contact member) embodied in one or more nanowires.

Figure 2A:
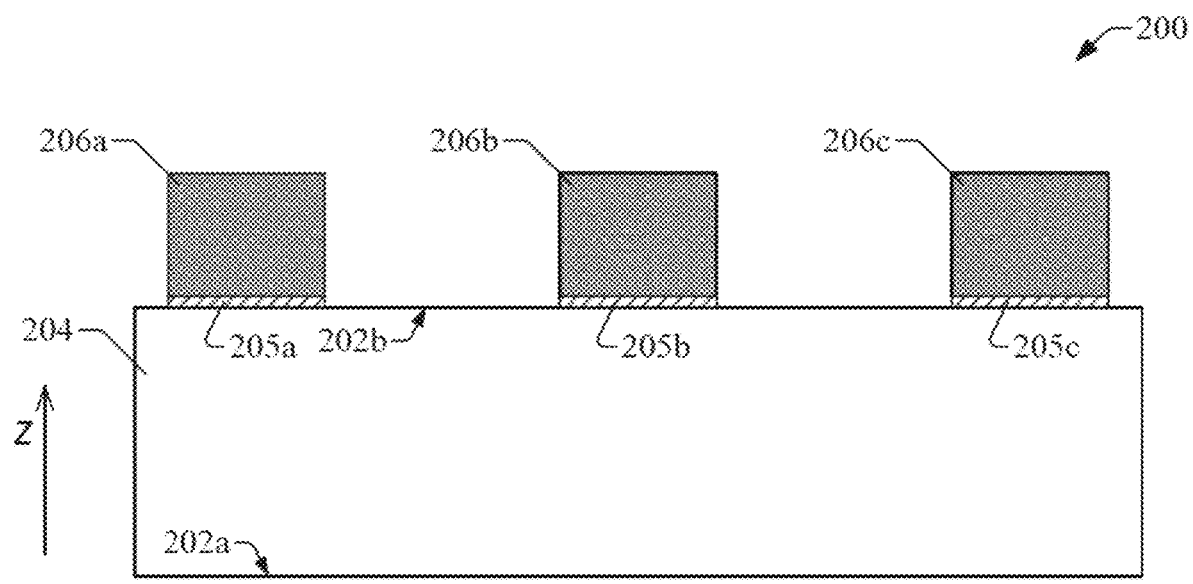
FIGS. 2A-2I illustrate schematic cross-sectional views of examples of structures representative of respective stages of an example process for fabricating a semiconductor device in accordance with one or more embodiments of the disclosure. Specifically.

FIGS. 2A-2I illustrate schematic cross-sectional views of structures representative of respective stages of an example process for fabricating a semiconductor device in accordance with one or more embodiments of the disclosure. Specifically, FIG. 2A illustrates a schematic cross-sectional view of a solid structure 200 in accordance with one or more embodiments of the disclosure. The solid structure 200 includes a semiconductor substrate 204 having a first surface 202a and a second surface 202b opposite to the first surface 202a. The solid structure 200 also includes a group of contact members, including contact member 206a, contact member 206b, and contact member 206c. As mentioned, in some embodiments, each of the contact members in the group of contact member can include or otherwise can be formed from a conductive material, e.g., a metal, a metallic alloy, a doped semiconductor or another type of semiconductor having mobile carriers. The solid structure 200 can further include a group of dielectric layers, each (or, in some embodiments, at least one) of the dielectric layers in such a group can form an interface with a respective one of the contact members in the group of contact members. As illustrated, the group of dielectric layers can include a dielectric layer 205a, dielectric layer 205b, and dielectric layer 205c. The dielectric layer 205a forms a first interface with the contact member 206a; the dielectric layer 205b forms a second interface with the dielectric layer 205b, and the dielectric layer 205c forms a third dielectric layer with the dielectric layer 205c. In some aspects, respective portions of the first interface, the second interface, and the third interface can be substantially planar and substantially parallel to the second surface 202b.

Figure 2B:
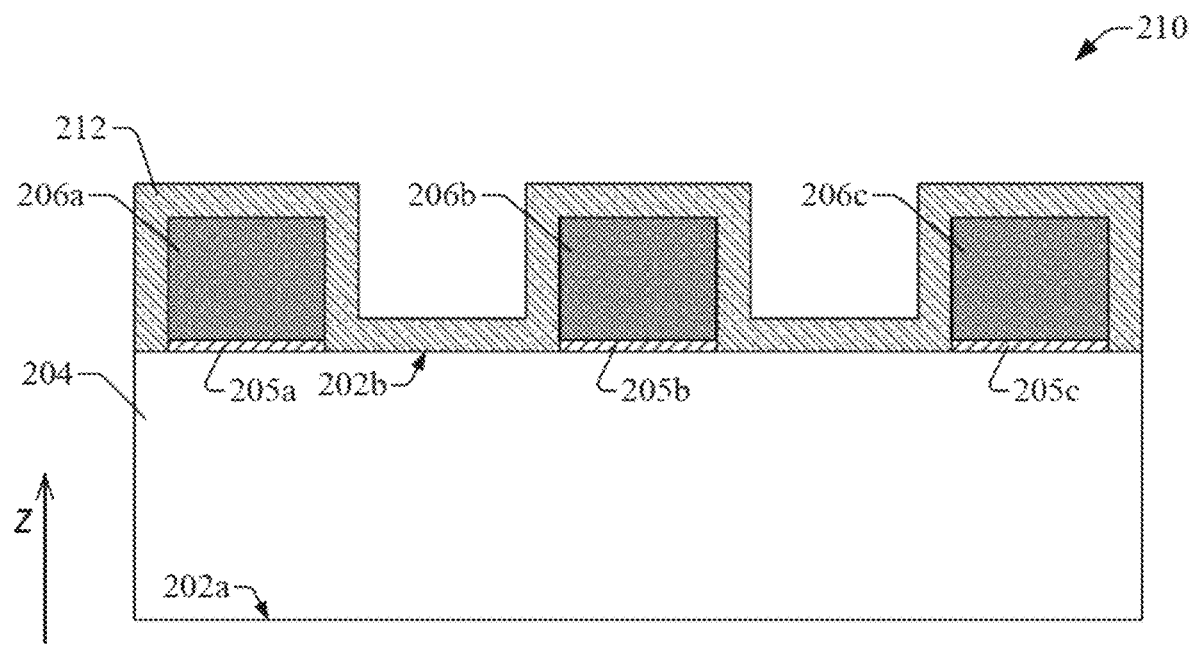

The solid structure 200 can be treated to form the solid structure 210, as shown in FIG. 2B. Treating the solid structure 200 can include, in some implementations, depositing an amount of a dielectric material of a first type (e.g., a specific compound, such as an oxide, a nitride, etc.) on at least a portion of a surface of solid structure 200. The surface includes exposed portions of the surface 202b. As illustrated in FIG. 2B, depositing the amount of the dielectric material can result in a conformal dielectric layer 212. In some aspects, deposition of the amount of the dielectric material can be accomplished by one or a combination of numerous deposition processes, including, for example, chemical vapor deposition (CVD); atomic layer deposition (ALD); physical vapor deposition (PVD); sputtering; chemical solution deposition; molecular beam epitaxy (MBE); or the like; or the like. Chemical vapor deposition can include, for example, metal organic chemical vapor deposition (MOCVD), low-pressure chemical vapor deposition (LPCVD), or plasma enhanced chemical vapor deposition (PECVD).

Figure 2C:
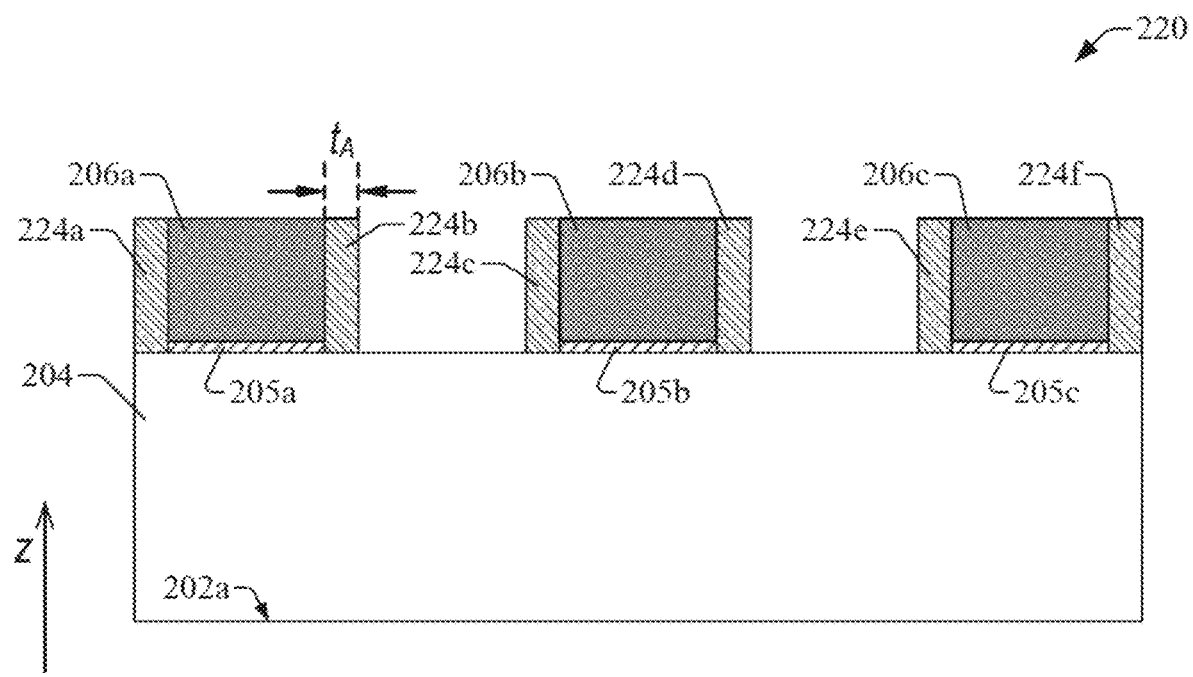

As part of the example process, the solid structure 210 can be treated to remove portions of the conformal dielectric layer 212. As illustrated in FIG. 2C, removing such portions can result in a solid structure 220 having first spacer layers, including spacer layer 224a, spacer layer 224b, spacer layer 224c, spacer layer 224d, spacer layer 224d, spacer layer 224e, and spacer layer 224d, and sections of the surface 202b exposed. In order to remove the portions of the conformal dielectric layer 212, treating the solid structure 220 can include selectively etching the dielectric material that constitutes the conformal dielectric layer 212. To that end, the etching can include subjecting the conformal layer 212 to a wet etch process or a dry etch process. In some aspects, wet etching relies on a liquid solution for the removal of a material and generally is isotropic. Wet etching can utilize or otherwise rely upon aqueous hydroxide chemistries, including ammonium hydroxide and potassium hydroxide, solution of carboxylic acid/nitric acid/hydrofluoric acid, and solutions of citric acid/nitric acid/hydrofluoric acid. In other aspects, dry etching generally refers to etching that does not rely on a solution for the removal of a material, and generally is anisotropic. Dry etching can rely on plasma (e.g., a gas of electrons) or ions. As such, dry etching includes plasma etching and reactive-ion etching (RIE) and its variants, such as deep REI.

Each (or, in some embodiments, at least two) of the spacer layers included in the solid structure 220 can have substantially the same thickness $t_A$ (a natural number in units of length). Without intending to be bound by phenomenology or modeling, a first thickness of a first spacer layer (e.g., spacer layer 224c) and a second thickness of a second spacer layer (e.g., spacer layer 224d) are substantially the same when difference between the first thickness and the second thickness is within magnitude of systematic variation in thickness introduced by the etch process utilized to form the first spacer layer and the second spacer layer.

Figure 2D:
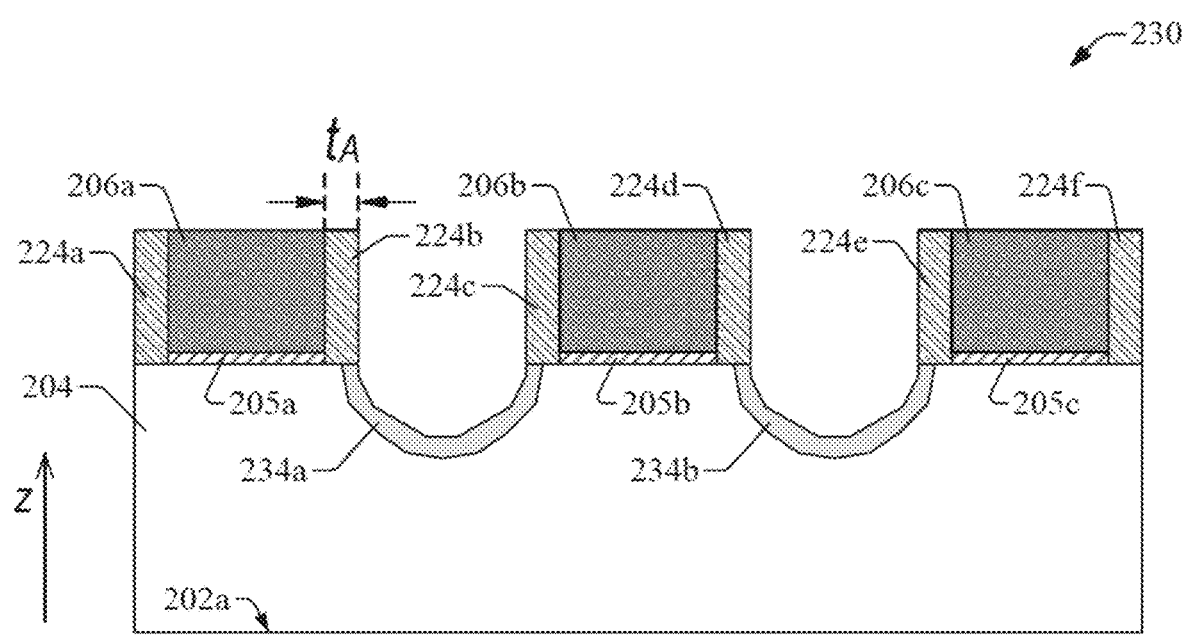

As another part of the example process, the solid structure 220 can be treated to form trenches or other types of recesses, resulting in a solid structure 230 as is shown in FIG. 2D. In some scenarios, at least one of the trenches can be embodied in respective V-shaped groove(s). In other scenarios, at least one of the trenches can be embodied in respective U-shaped groove(s). As illustrated in FIG. 2D, two trenches can be formed in the semiconductor substrate 204. A first carrier-doped layer 234a can define or otherwise bound a first trench of the two trenches, and a second carrier-doped layer 234b can define or otherwise bound a second trench of the two trenches. In some embodiments, the first carrier-doped layer 234a and the second carrier-doped layer 234b can each be embodied in or can include an n-type doped epitaxial layer. In other embodiments, the first carrier-doped layer 234a and the second carrier-doped layer 234b can each be embodied in or can include a p-type doped epitaxial layer.

Figure 3A:
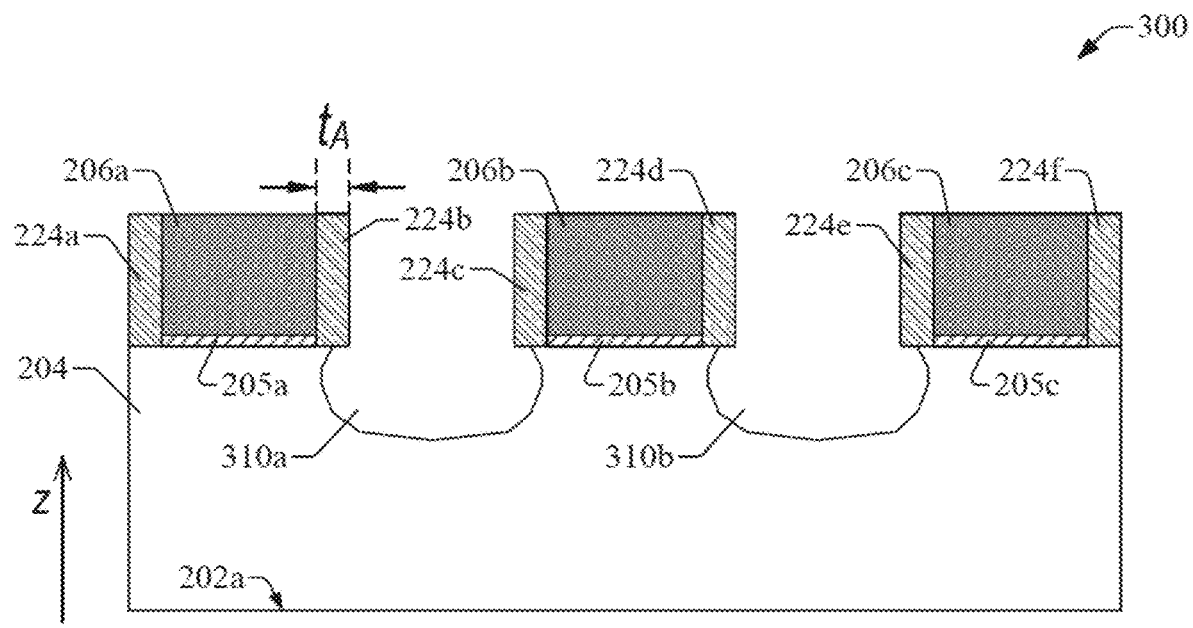
FIGS. 3A-3B illustrate schematic cross-sectional views representative of stages of an example of a process for forming a doped epitaxial layer in accordance with one or more embodiments of the disclosure. Specifically.
Figure 3B:
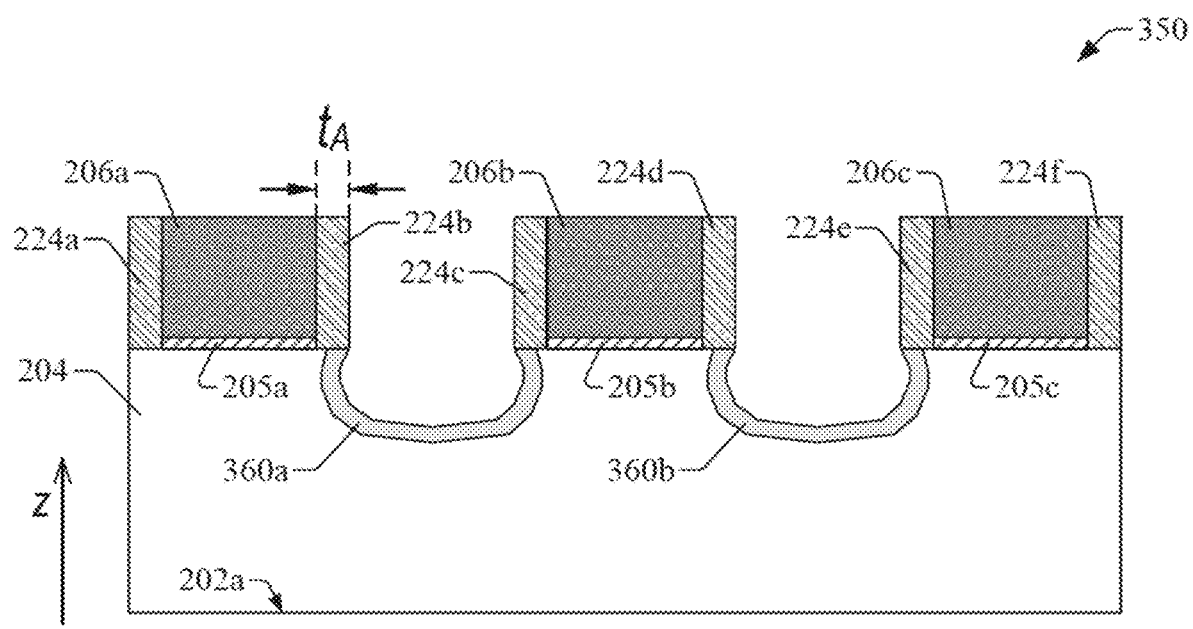

Treating the solid structure 220 can include subjecting the solid structure 220 to one of numerous processes, each including one or more stages. In some embodiments, one such process is illustrated in FIGS. 3A-3B. Specifically, portions of the solid structure 220 can be selectively removed to form recesses in the semiconductor substrate 204 (e.g., a silicon film). Removing such portions can include, in some implementations, selectively etching the semiconductor substrate 204 at exposed portions of the surface 202b opposite the surface 202a. Similar to other etchings disclosed herein, etching the semiconductor substrate 204 can include subjecting such exposed portions to one of a wet etch process or a dry etch process. FIG. 3A illustrates an example solid structure 300 resulting from the foregoing treatment of the solid structure 220. A recess 310a and a recess 310b can be formed, each having a U shape, for example. Forming the recess 310a can yield respective undercuts beneath the spacer layer 224c and the spacer 224. The disclosure is not limited in that respect and, in some embodiments, forming the recess 310a may not yield an undercut beneath the spacer layer 224c.

Further, the process can include forming one or more respective carrier-doped epitaxial layers on one or more respective recesses of the recesses formed in the semiconductor substrate 204. Thus, in one aspect, a carrier-doped layer is conformal with the surface of a recess of the one or more respective recesses. Each (or, in some embodiments, at least one) of the carrier-doped layers can be thin, having respective thickness of about one ML to a few MLs (e.g., 2 ML, 3 ML, 4 ML, 5 ML, or the like). In some implementations, forming a carrier-doped epitaxial layer can include subjecting the surface of a recess to CVD of an amount of a semiconductor precursor (e.g., silane, disilane, or trisilane for Si deposition) and a dopant precursor—e.g., $N_2$ or $NH_3$, $PH_3$, or $AsH_3$ for n-type doping; or $B_2H_3$, $AlCl_3$, trimethyl-aluminum or triethyl-aluminum for p-type doping. As such, in one embodiment, phosphorous-doped epitaxial layers can be respectively deposited on the recess 310a and the recess 310b, resulting in an n-doped epitaxial layer 360a and another n-doped epitaxial layer 360b. In another embodiment, boron-doped epitaxial layers can be respectively deposited on the recess 310a and the recess 310b, resulting in a p-doped epitaxial layer 360a and another n-doped epitaxial layer 360b.

Figure 4A:
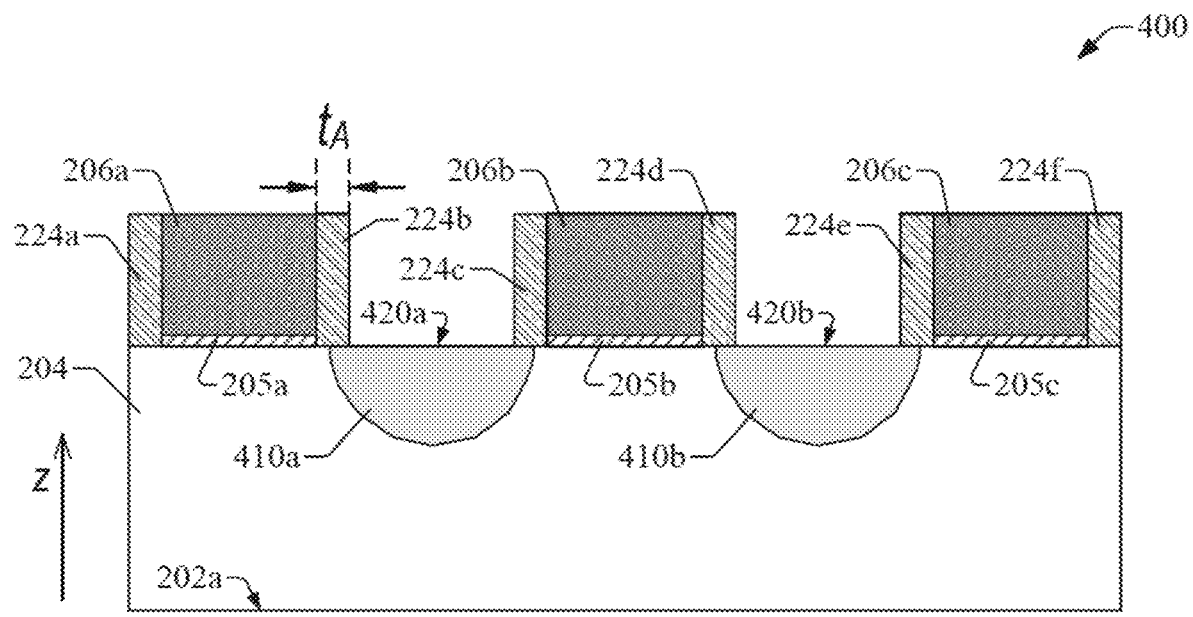
FIGS. 4A-4B illustrate schematic cross-sectional views representative of stages of an example of another process for forming a doped epitaxial layer in accordance with one or more embodiments of the disclosure. Specifically.
Figure 4B:
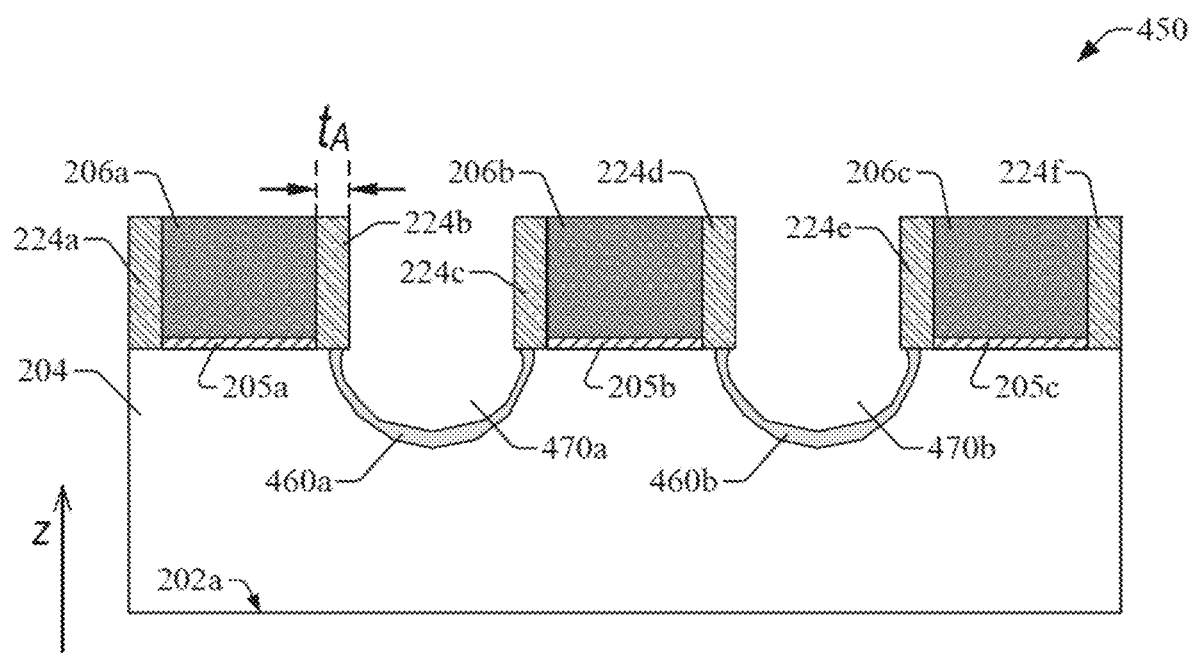

As mentioned, the solid structure 220 can be subjected to other processes, each including one or more stages, to form carrier-doped epitaxial layers within the semiconductor substrate 204. In some embodiments, another such process is illustrated in FIGS. 4A-4B. The process can include ion implantation. Specifically, respective regions beneath and including the exposed portions of the surface 202b can be implanted with ions (negative ions for n-type doping and positive ions for p-type doping) in order to form a carrier-doped region within the semiconductor substrate 204. As illustrated in FIG. 4A, a carrier-doped region 410a can be formed between and, at least partially, underneath the spacer layer 224b and the spacer layer 224c. A carrier-doped region 410b also can be formed between and, at least partially, underneath the spacer layer 224d and the spacer layer 224e. The carrier-doped region 410a and the carrier-doped region 410b have, respectively, a substantially planar surface 420a and a substantially planar surface 420b, both substantially aligned with the surface 202b.

The process for forming the carrier-doped epitaxial layers also includes removing respective portions of the carrier-doped regions formed by ion implantation within the semiconductor substrate 204. The removal of such portions also results in the formation of a trench of another type of recess. As illustrated in FIG. 4B, the process can include removing a portion of carrier-doped region 410a and another portion of the carrier-doped region 410b. To that end, in some implementations, the removing can include selectively etching the carrier-doped region 410a and the carrier-doped region 410b for a defined period to achieve a thin carrier-doped epitaxial layer (e.g., a layer having a thickness in a range from about 1 ML to about 5 ML). Therefore, as is shown in FIG. 4B, a carrier-doped epitaxial layer 460a (e.g., an n-type epitaxial layer or a p-type epitaxial layer) and a carrier-doped epitaxial layer 460b (e.g., an n-type epitaxial layer or a p-type epitaxial layer) can be formed. As mentioned, a trench 470a (e.g., a U-shaped groove or a V-shaped groove) and a trench 470b (e.g., a U-shaped groove or a V-shaped groove) also are formed.

Figure 2E:
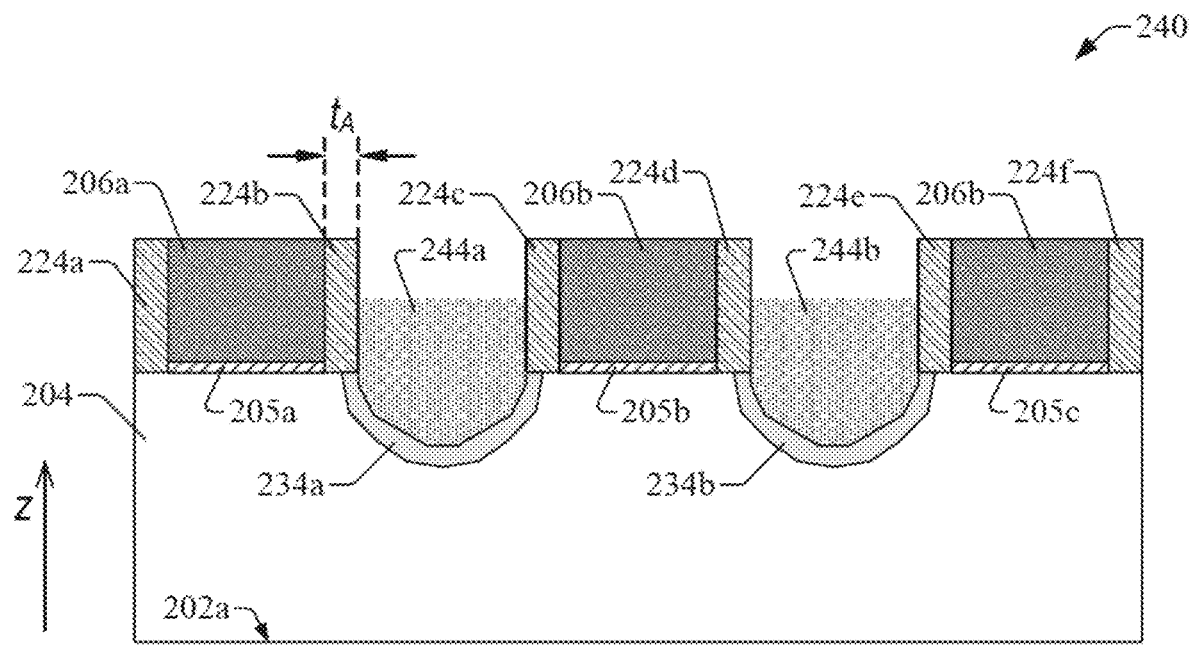

With further reference to the series of FIGS. 2A-2I, in another stage of the example process for fabricating a semiconductor structure in accordance with aspects of this disclosure, two or more of the trenches (or, in some embodiments, other types of recesses) present in the in the solid structure 230 can be filled with a conductive material. To that end, an amount of the conductive material can be deposited on each of the two or more trenches, resulting in the solid structure 240 as shown in FIG. 2E. The conductive material can be embodied in or can include a metal, a metallic alloy, a doped semiconductor, a combination thereof, or the like. As illustrated, in one aspect, the amount of the conductive material deposited on a trench can form a contact member that extends above the surface opposite to the surface 202a, along the z-direction. Specifically, a contact member 244a can be formed on a surface of the carrier-doped epitaxial layer 234a, and a contact member 244b can be formed on a surface of the carrier-doped epitaxial layer 234b. While respective exposed surfaces of each of the contact member 244a and the contact member 244b are illustrated as planar surfaces for the sake of simplicity, the disclosure is not limited in that respect. Thus, in some embodiments, each of an exposed surface of the contact member 244a and another exposed surface of the contact member 244b can be embodied in a curved surface (e.g., a U-shape surface or V-shape surface) or an undulating surface.

Figure 2F:
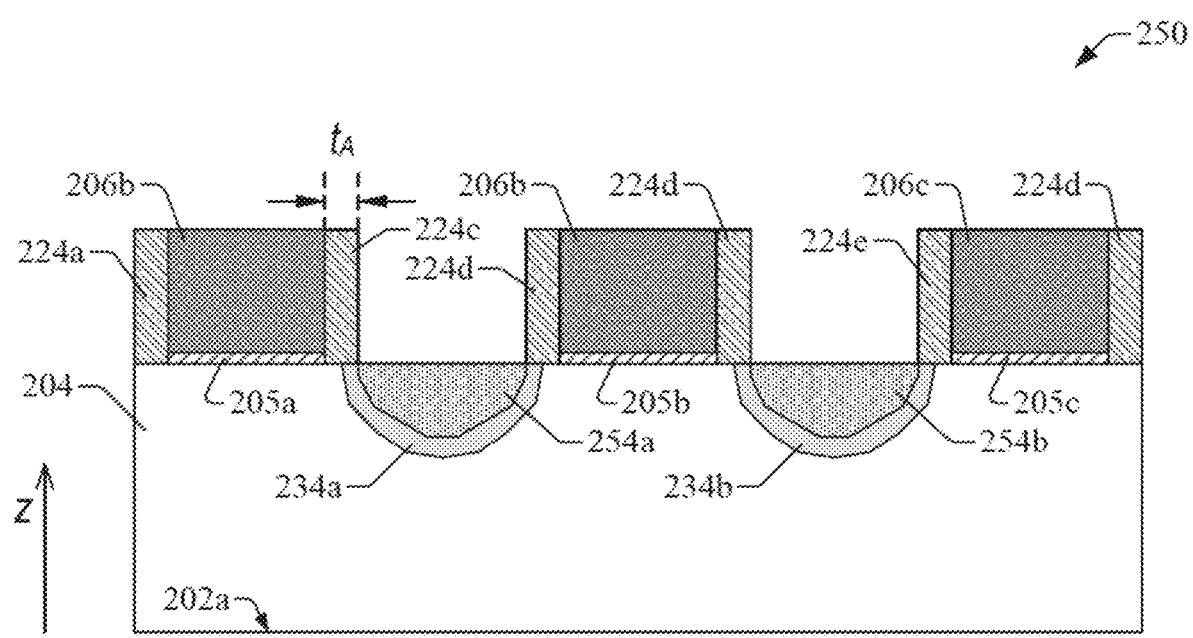

As such, in some embodiments, the overburden portion of a conductive member formed on the surface of a trench (or, in some embodiments, in another type of recess) can be treated to form a substantially planar conductive surface aligned with the surface opposite to the surface 202a. As illustrated in FIG. 2F, treating in such a fashion the respective overburden portions of contact member 244a and the contact member 244b can result in the solid structure 250. Specifically, the contact member 244a can be etched to form a planar interface 256a. To that end, in some implementations, etching the contact member 244a can include subjecting the contact member 244a to one of a wet etch process or a dry etch process. In addition, the contact member 244b can be etched to form a planar surface 256b. Similar to the treatment of the contact member 244a, etching the contact member 244b can include subjecting the contact member 244b to one of the wet etch process or the dry etch process.

Figure 2G:
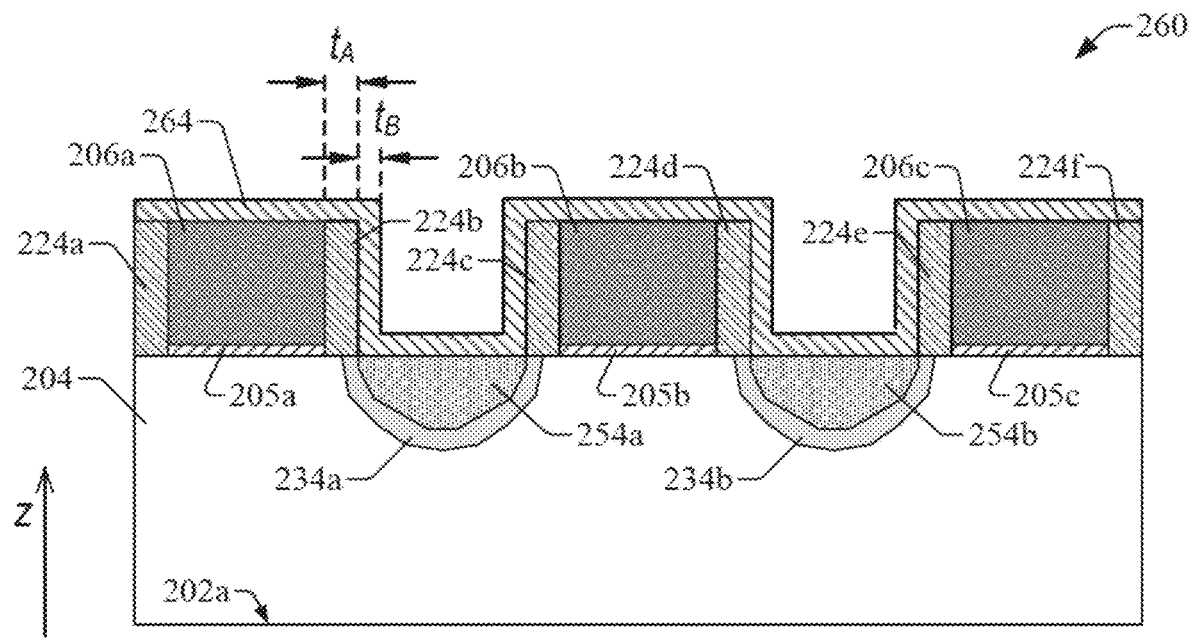

The solid structure 250 can be treated to form the solid structure 260, as shown in FIG. 2G. Treating the solid structure 250 can include, in some implementations, depositing an amount of a dielectric material of a second type (e.g., a specific compound, such as an oxide, a nitride, etc.) on at least a portion of a surface of the solid structure 250. The surface includes the exposed planar surfaces 256a and 256b. As illustrated in FIG. 2G, depositing the amount of the dielectric material of the second type can result in a conformal dielectric layer 264. Similar to the deposition of the dielectric material of the first type, in some aspects, deposition of the amount of the dielectric material of the second type can be accomplished by one or a combination of numerous deposition processes, including, for example, CVD, ALD, PVD, sputtering, chemical solution deposition, MBE, or the like.

Figure 2H:
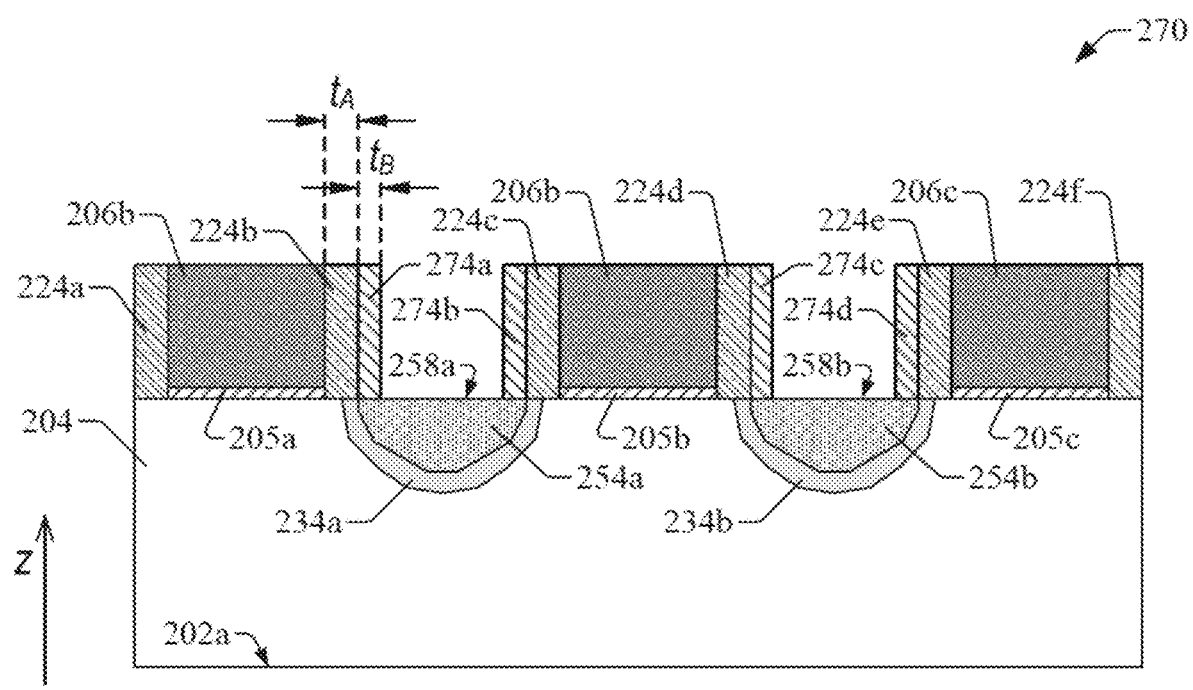
Figure 2I:
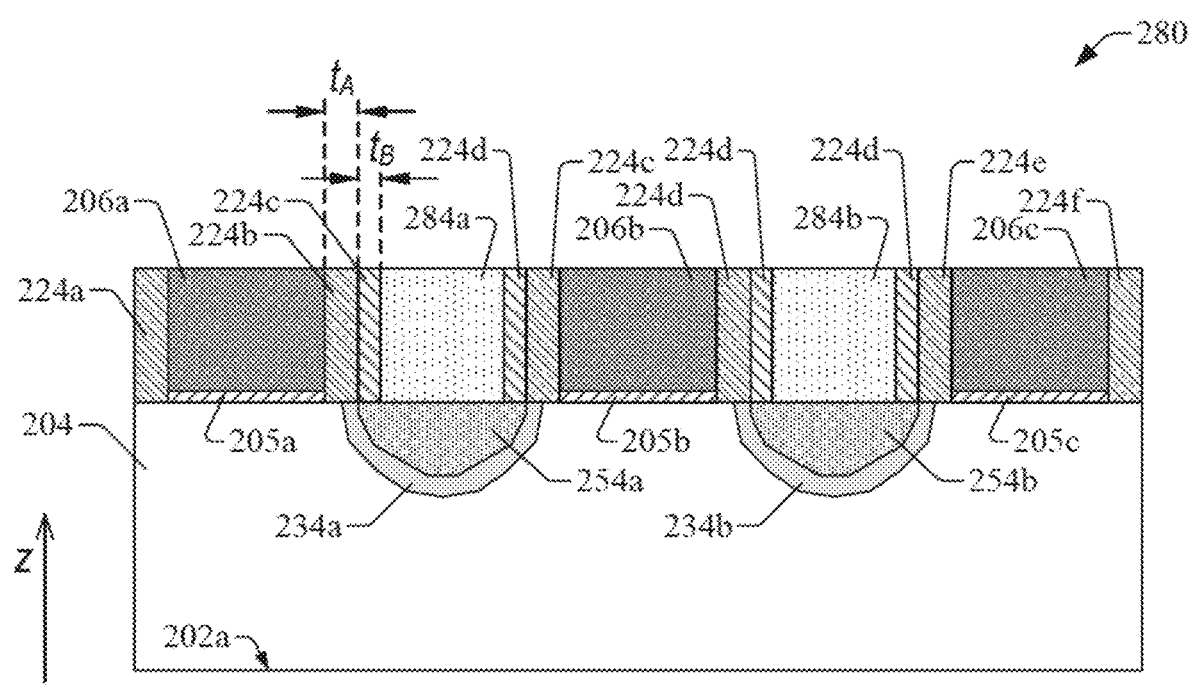

Further, as part of the example process, the solid structure 260 can be treated to remove portions of the conformal dielectric layer 264. As illustrated in FIG. 2H, removing such portions can result in a solid structure 270 having the first spacer layers described herein and second spacer layers, including spacer layer 274a, spacer layer 274b, spacer layer 274c, and spacer layer 274d, and respective sections of the planar interface 258a and planar interface 258b exposed. In order to remove the portions of the conformal dielectric layer 264, treating the solid structure 260 can include selectively etching the dielectric material that constitutes the conformal dielectric layer 264. To that end, the etching can include subjecting the conformal dielectric layer 264 to a wet etch process or a dry etch process.

Similar to other spacer layers disclosed herein, each (or, in some embodiments, at least two) of the second spacer layers included in the solid structure 270 can have substantially the same thickness $t_B$ (a real number in units of length). As illustrated and disclosed herein, a first spacer layer (e.g., spacer layer 224c) having thickness $t_A$ and a second spacer layer (e.g., spacer layer 274a) having thickness $t_B$ can form a composite spacer layer. The thickness of the composite spacer layer can permit exposing a portion of a planar interface of a contact member embedded in the semiconductor substrate 204.

To complete the fabrication of a semiconductor device in accordance with aspects of the disclosure, a stage of the example process can include filling the openings present in the solid structure 270 with a conductive material (such as a metal or a metallic alloy) that can be different from the other conductive material that forms the contact members 254a and 254b. To that end, in some implementations, an amount of the conductive material can be deposited on the exposed portions of the planar interfaces 256a and 256b to form a conductive interconnect member 284a and a conductive interconnect member 284b, as is shown in the solid structure 280 in FIG. 2I.

Figure 5A:
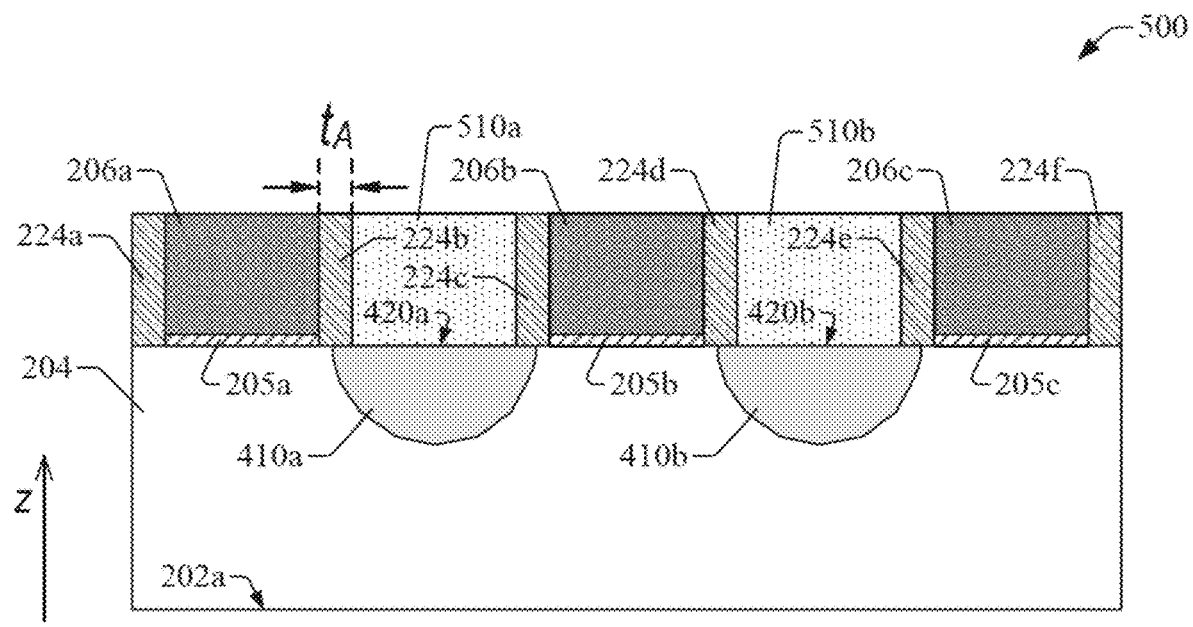
FIGS. 5A-5B illustrate schematic cross-sectional views representative of stages of an example of another process for forming a conductive interconnect member and doped epitaxial layer, in accordance with one or more embodiments of the disclosure. Specifically.

It some embodiments, a recess or trench formation need not be relied upon in order to form of a conductive interconnect member similar to the combination of the member 284a and member 254a, or the combination of member 284b member 254b. To that end, in one such embodiment, the solid structure illustrated in FIG. 4A can be treated to form a conductive member 510a and a conductive member 510b, as is shown in FIG. 5A. Specifically, in some aspects, treating such a solid structure can include depositing an amount of a conductive material (e.g., a metal or a metallic alloy) can be deposited in the exposed surfaces 420a and 420b.

Figure 5B:
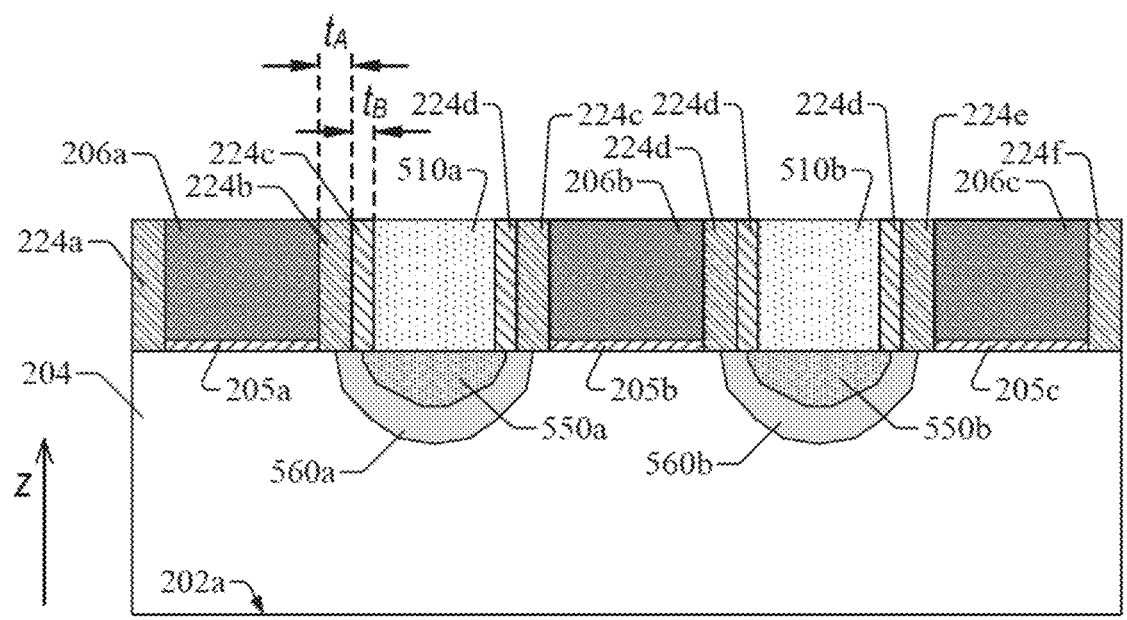

Each of the conductive members 510a and 510b can be annealed or otherwise subjected to a thermal treatment. Annealing or subjecting the conductive member 510a and the conductive member 510b can include heating the conductive members 510a and 510b to a defined temperature and maintaining the defined temperature for a defined period. In one example, the defined temperature can be equal to a fraction of a melting temperature of a conductive material the constitutes at least one of the conductive members 510a and 510b, and the defined period can be in a range from about 1 minute to about 100 minutes. The annealing or the thermal treatment of the conductive member 510a and the conductive member 510b can result in diffusion of atoms or ions from the conductive member 510a and the conductive member 510b to the carrier-doped region 410a and the carrier-doped region 410b, respectively. In addition, diffusion of other atoms or other ions from the carrier-doped region 410a and the carrier-doped region 410b to the conductive member 510a and the conductive member 510b, respectively. In some embodiments, such inter-diffusion can yield a metal self-aligned silicide (metal salicide) region 550a and a metal salicide region 550b. In addition, the inter-diffusion can yield a carrier-doped layer 560a and a carrier-doped layer 560b, as is illustrated in FIG. 5B.

In view of the aspects described herein, numerous other processes can be implemented for providing a semiconductor device in accordance with one or more embodiments of this disclosure. Examples of such processes can be better appreciated with reference to the flowchart in FIG. 6. Each block in the illustrated flowchart can represent a process stage or process operation (e.g., etching or removal of an amount of a material, coating of a structure with another amount of another material, epitaxial growth of carrier-doped layer, and the like). Although a particular order of the blocks within an illustrated flowchart is provided, such an ordering is not limiting and the order two or more of the blocks can be altered without affecting the outcome of the process. For the sake of clarity, well-known elements or aspects of a block in the illustrated flowcharts may not be described in full detail. As with any other processes described herein, in some embodiments, the example method 600 illustrated in FIG. 6 can be implemented in conjunction with other processes.

Figure 6:
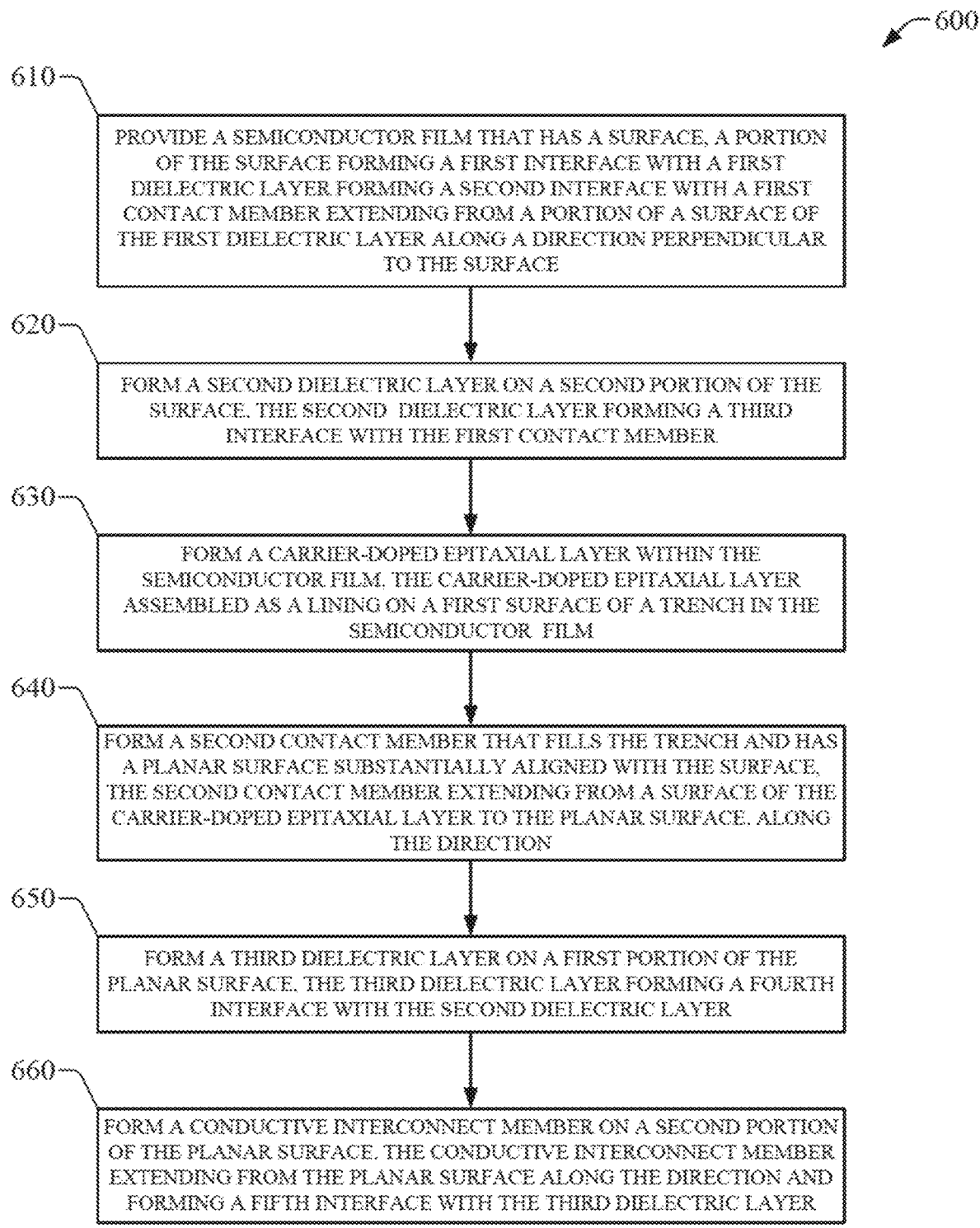
FIG. 6 illustrates an example of method for fabricating a solid assembly in accordance with one or more embodiments of the disclosure. The solid assembly can constitute a semiconductor device in accordance with one or more embodiments of the disclosure.

FIG. 6 illustrates an example of a method for providing a solid assembly in accordance with one or more embodiments of the disclosure. At block 610, a semiconductor film that has a first surface and a second surface opposite to the first surface can be provided. In some embodiments, the semiconductor film can constitute a semiconductor substrate or wafer, such as semiconductor substrate 110. In some aspects, a portion of the second surface (e.g., surface 202b) can form a first interface with a first dielectric layer (e.g., a gate dielectric layer, such as dielectric layer 125b) forming a second interface with a first contact member extending from a portion of a surface of the first dielectric layer along a direction perpendicular to the second surface. In one example, the first contact member can embody or can include the contact member 130b illustrated in FIG. 1.

At block 620, a second dielectric layer can be formed on a second portion of the second surface. In some aspects, the second dielectric layer can form a third interface with the first contact member, where the third interface can be substantially perpendicular to the second surface. At block 630, a carrier-doped epitaxial layer can be formed on a second portion of the second surface. In some embodiments, the carrier-doped epitaxial layer can be assembled as a lining on a first surface of a trench (or another type of recess) in the semiconductor film. In some implementations, as described herein, the carrier-doped epitaxial layer can be embodied in or can include an n-doped epitaxial layer or a p-doped epitaxial layer. At block 640, a second contact member that fills the trench (or the other type of recess) and has a planar surface substantially aligned with the second surface can be formed. In some implementations, the second contact member can extend, along the direction, from a second surface of the carrier-doped epitaxial layer to the planar surface. At block 650, a third dielectric layer on a first portion of the planar surface can be formed. In some embodiments, the third dielectric layer can form a fourth interface with the second dielectric layer. In one embodiment, the second dielectric layer can be embodied in or can include the dielectric layer 120c, and the third dielectric layer can be embodied in or can include the dielectric layer 140b. At block 660, a conductive interconnect member can be formed on a second portion of the planar surface. In some aspects, the conductive interconnect member can extend from the planar surface along the direction and can form a fifth interface with the third dielectric layer (e.g., dielectric layer 140b). In some embodiments, as illustrated in FIG. 1, the conductive interconnect member can be embodied in or can include the conductive interconnect 150a.

Figure 7:
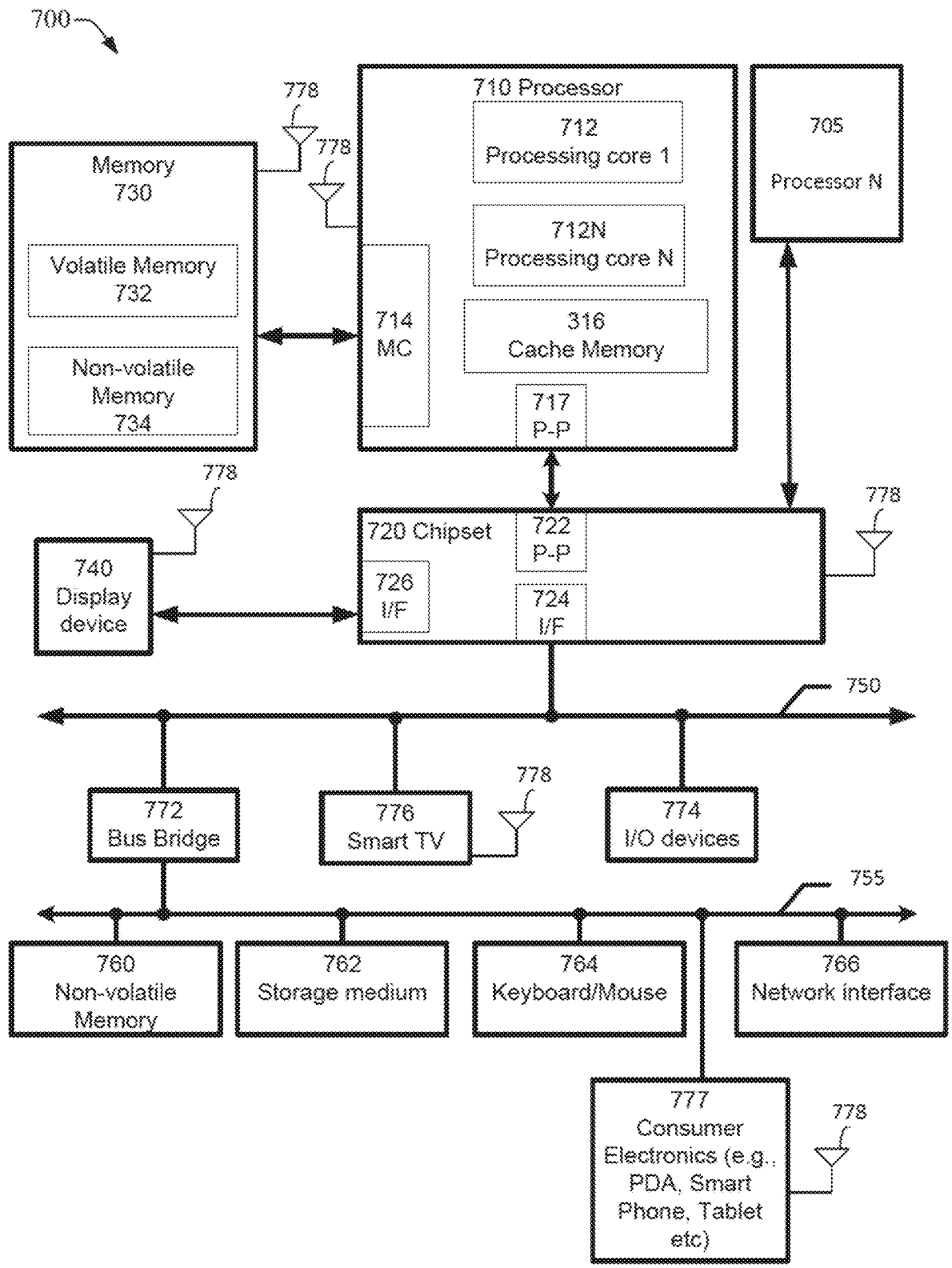
FIG. 7 illustrates an example of a system that utilizes solid-state devices in accordance with one or more embodiments of the disclosure.

FIG. 7 depicts an example of a system 700 according to one or more embodiments of the disclosure. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 can include a system on a chip (SOC) system or a system-in-package (SiP).

In one embodiment, system 700 includes multiple processors including processor 710 and processor N 705, where processor 705 has logic similar or identical to the logic of processor 710. In one embodiment, processor 710 has one or more processing cores (represented here by processing core 712 and processing core 712N, where 712N represents the Nth processor core inside processor 710, where N is a positive integer). More processing cores can be present (but not depicted in the diagram of FIG. 7). In some embodiments, processing core 712 includes, but is not limited to, pre-fetch logic to fetch instructions, decode logic to decode the instructions, execution logic to execute instructions, a combination thereof, or the like. In some embodiments, processor 710 has a cache memory 716 to cache instructions and/or data for system 700. Cache memory 716 may be organized into a hierarchical structure including one or more levels of cache memory.

In some embodiments, processor 710 includes a memory controller (MC) 714, which is configured to perform functions that enable the processor 710 to access and communicate with memory 730 that includes a volatile memory 732 and/or a non-volatile memory 734. In some embodiments, processor 710 can be coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory device 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interface 717 and P-P interface 722. Chipset 720 enables processor 710 to connect to other elements in system 900. In some embodiments of the disclosure, P-P interface 717 and P-P interface 722 can operate in accordance with a PtP communication protocol, such as the Intel® QuickPath Interconnect (QPI) or the like. In other embodiments, a different interconnect may be used.

In some embodiments, chipset 720 can be configured to communicate with processor 710, 705N, display device 740, and other devices 772, 776, 774, 760, 762, 764, 766, 777, etc. Chipset 720 may also be coupled to the wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the disclosure, processor 710 and chipset 720 are integrated into a single SOC. In addition, chipset 720 connects to bus 750 and/or bus 755 that interconnect various elements 774, 760, 762, 764, and 766. Bus 750 and bus 755 may be interconnected via a bus bridge 772. In one embodiment, chipset 720 couples with a non-volatile memory 760, a mass storage device(s) 762, a keyboard/mouse 764, and a network interface 766 via interface 724 and/or 704, smart TV 776, consumer electronics 777, etc.

In one embodiment, mass storage device(s) 762 can include, but not be limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 900, the functions performed by some of these blocks may be integrated within a single semiconductor circuit or may be implemented using two or more separate integrated circuits. For example, although cache memory 716 is depicted as a separate block within processor 710, cache memory 716 or selected elements thereof can be incorporated into processor core 712.

It is noted that the system 700 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor devices (for example, the semiconductor device described in connection with FIG. 1) or other types of semiconductor devices, as disclosed herein, may be provided in any variety of electronic device including consumer, industrial, military, communications, infrastructural, and/or other electronic devices.

The semiconductor devices or other types of solid-state devices, as described herein, may be embody or may constitute one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor devices, as described herein, may embody or may constitute one or more memory chips or other types of memory devices. The memory chips may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAMBUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor devices in accordance with this disclosure are provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

The semiconductor devices and other types of solid assemblies in accordance with aspects of the disclosure may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel®

Atom® processor(s) family or Intel-64 processors (for example, Sandy Bridge®, Ivy Bridge®, Haswell®, Broadwell®, Skylake®, etc.).

Additionally or alternatively, semiconductor devices and other types of solid assemblies in accordance with aspects of the disclosure may be used in connection with one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, an electronic device in which the semiconductor devices and other types of solid assemblies in accordance with aspects of the disclosure can be used and/or provided may be a computing device. Such a computing device may house one or more boards on which the interconnects may be disposed. The board may include a number of components including, but not limited to, a processor and/or at least one communication chip. The processor may be physically and electrically connected to the board through, for example, electrical connections of the interconnects. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

FURTHER EXAMPLES

The following example embodiments pertain to further embodiments of this disclosure. Example 1 is a solid assembly, comprising: a semiconductor film having a surface; a first contact member assembled adjacent to a portion of the surface, the first contact member forming a first planar interface with a first dielectric layer in contact with the portion of the surface; a second dielectric layer assembled adjacently to the first contact member, the second dielectric layer forming a second planar interface with the first contact member, the second planar interface being substantially perpendicular to the first planar interface; a third dielectric layer assembled adjacently to the second dielectric layer, the third dielectric layer forming a third planar interface with the second dielectric layer, the third planar interface being substantially parallel to the second planar interface; a conductive interconnect assembled adjacently to the third dielectric layer, the conductive interconnect forming a fourth planar interface with the second dielectric layer, the fourth interface extending along the second direction; a second contact member embedded in the semiconductor film, the second contact member forming a fifth planar interface with the conductive interconnect, the planar interface registered with the surface; and a carrier-doped epitaxial layer forming a non-planar interface with the second contact member. In example 2, the solid assembly of example 1 can optionally include the second dielectric layer comprising at least one of a silicon oxide or a high-k dielectric, and the third dielectric layer comprising a low-k material. In example 3, the solid assembly of any one of examples 1-2 can optionally include the third dielectric layer comprising at least one of silicon dioxide or a low-k material. In example 4, the solid assembly of any one of examples 1-2 can optionally include the third dielectric layer comprising an air gap. In example 5, the solid assembly of any one of examples 1-4 can optionally include the second dielectric layer having a thickness in a range from about 0.5 nm to about 10.0 nm. In example 6, the solid assembly of any one of examples 1-5 can optionally include the third dielectric layer having a thickness in a range from about 0.5 nm to about 10.0 nm. In example 7, the solid assembly of any one of examples 1-4 can optionally include the second dielectric layer having a first thickness and the third dielectric layer having a second thickness, and the first thickness and the second thickness amounting to a total thickness in a range from about 1.0 nm to about 10.0 nm. In example 8, the solid assembly of any one of examples 1-7 can optionally include the conductive interconnect comprising copper, aluminum, tungsten, titanium, tantalum, silver, gold, palladium, platinum, zinc, nickel, or an alloy of two or more of the foregoing metals. In example 9, the solid assembly of any one of examples 1-8 can optionally include the first contact member comprising copper, aluminum, tungsten, titanium, tantalum, silver, gold, palladium, platinum, zinc, nickel, or an alloy of two or more of the foregoing metals. In example 10, the solid assembly of any one of examples 1-9 can optionally include the second contact member comprising copper, aluminum, tungsten, titanium, tantalum, silver, gold, palladium, platinum, zinc, nickel, or an alloy of two or more of the foregoing metals. In example 11, the solid assembly of any one of examples 1-10 can optionally include carrier-doped epitaxial layer comprising one of an n-type epitaxial layer or a p-type epitaxial layer. In example 12, the solid assembly of any one of examples 1-11 can optionally include the semiconductor film comprising silicon, germanium, an alloy of silicon and germanium, a III-V semiconductor compound, or a II-VI semiconductor compound, phosphorous and silicon, or boron and silicon. In example 13, the solid assembly of example 11 can optionally include the carrier-doped epitaxial layer comprising one of a P-doped epitaxial layer, an As-doped epitaxial layer, a N-doped epitaxial layer; a B-doped epitaxial layer, or an Al-doped epitaxial layer.

Further, Example 14 is a method for a solid assembly, comprising: providing a semiconductor substrate that has a surface, a portion of the surface forming a first interface with a first dielectric layer forming a second interface with a first contact member; forming a second dielectric layer of a first thickness on a second portion of the surface, the second dielectric layer forming a third interface with the first contact member; forming a carrier-doped epitaxial layer within the semiconductor substrate; the carrier-doped epitaxial layer assembled as a lining on a surface of a trench in the semiconductor substrate; forming a second contact member that fills the trench and has a planar surface substantially aligned with the surface, the second contact member extending from a surface of the carrier-doped epitaxial layer to the planar surface, along a direction perpendicular to the surface; forming a third dielectric layer of a second thickness on a first portion of the planar surface, the third dielectric layer forming a fourth interface with the second dielectric layer; and forming a conductive interconnect member on a second portion of the planar surface, the conductive interconnect member extending from the planar surface along the direction and forming a fifth interface with the third dielectric layer. In example 15, the method of example 14 can optionally include forming the second dielectric layer comprising depositing a conformal layer of a high-k dielectric material on the first contact member and the second portion of the surface, the conformal layer having the first thickness, and removing a portion of the conformal layer. In example 16, the method of any one of examples 14-15 can optionally include forming the carrier-doped epitaxial layer comprising etching the semiconductor substrate to form the trench, and depositing one of an n-type epitaxial layer or a p-type epitaxial layer by means of chemical vapor deposition (CVD). In example 17, the method of any one of examples 14-16 can optionally include forming the carrier-doped epitaxial layer comprising forming one of a p-type region by subjecting a third portion of the surface to ion implantation, the formed p-type region embedded in the semiconductor substrate and having a planar surface adjacent to the second portion of the surface, and etching a portion of the formed p-type region, resulting in a p-type epitaxial layer. In example 18, the method of any one of examples 14-17 can optionally include forming the carrier-doped epitaxial layer comprising forming one of an n-type region by subjecting a third portion of the surface to ion implantation, the formed n-type region embedded in the semiconductor substrate and having a planar surface adjacent to the second portion of the surface, and etching a portion of the formed n-type region, resulting in an n-type epitaxial layer. In example 19, the method of any one of examples 14-18 can optionally include forming the second contact member comprising depositing an amount of a conductive material that fills the trench and yields an overburden layer above the surface, and planarizing the overburden layer to form the planar surface substantially aligned with the surface. In example 20, the method of any one of examples 14-19 can optionally include forming the third dielectric layer comprising depositing a conformal layer of a low-k dielectric material on the first contact member, the second dielectric layer, and the planar surface substantially aligned with the surface, the conformal layer having the second thickness, and removing a portion of the conformal layer, exposing the second portion of the planar surface. In example 21, the method of example 20 can optionally include forming the conductive interconnect member comprising depositing an amount of a conductive material on the second portion of the planar surface.

Example 22 is a method for a solid assembly, comprising: providing a semiconductor substrate that has a first surface and surface opposite to the first surface, a portion of the surface forming a first interface with a first dielectric layer forming a second interface with a first contact member; forming a second dielectric layer of a first thickness on a second portion of the surface, the second dielectric layer forming a third interface with the first contact member; forming a carrier-doped member within the semiconductor substrate, the carrier-doped member has a planar surface substantially aligned with the surface; forming a third dielectric layer of a second thickness on a first portion of the planar surface, the third dielectric layer forming a fourth interface with the second dielectric layer; and forming a conductive interconnect member on a second portion of the planar surface, the conductive interconnect member extending from the planar surface along the direction and forming a fifth interface with the third dielectric layer. In example 23, the method of example 22 can optionally include annealing the conductive interconnect member to modify the carrier-doped member into a carrier-doped epitaxial layer and a second contact member having an inter-diffused interface with the carrier-doped epitaxial layer. In example 24, the method of any one of examples 22-23 can optionally include forming the carrier-doped member comprising forming one of an n-type doped member comprising silicon or a p-type doped member comprising silicon, and the second contact member comprising a metal self-aligned silicide along the direction.

Further, Example 25 is a solid-state device, comprising: a semiconductor film having a surface; a gate contact assembled adjacent to a portion of the surface, the gate contact forming a first interface with a first dielectric layer in contact with the portion of the surface; a second dielectric layer assembled adjacent to the gate contact, the second dielectric layer forming a second interface with the gate contact; a third dielectric layer assembled adjacent to the second dielectric layer, the third dielectric layer forming a third interface with the second dielectric layer, the third interface being substantially parallel to the second interface; a conductive interconnect assembled adjacent to the third dielectric layer, the conductive interconnect forming a fourth interface with the third dielectric layer; a first contact embedded in the semiconductor film and assembled adjacent to the gate contact, the first contact forming a fifth interface with the conductive interconnect; a first carrier-doped epitaxial layer forming a non-planar interface with the first contact; a second contact embedded in the semiconductor film and assembled adjacent to the gate contact; and a second carrier-doped epitaxial layer forming a non-planar interface with the second contact. In example 26, the device of example 25 can optionally include the second dielectric layer comprising at least one of a silicon oxide or a high-k dielectric, and the third dielectric layer comprising a low-k material. In example 27, the device of any one of examples 25-26 can optionally include the third dielectric layer comprising at least one of silicon dioxide or a low-k material. In example 28, the device of any one of examples 25-27 can optionally include the second dielectric layer having a thickness in a range from about 0.5 nm to about 10.0 nm. In example 29, the device of any one of examples 25-28 can optionally include the third dielectric layer having a thickness in a range from about 0.5 nm to about 10.0 nm. In example 30, the device of any one of examples 25-27 can optionally include the second dielectric layer having a first thickness and the third dielectric layer having a second thickness, and the first thickness and the second thickness amounting to a total thickness in a range from about 1.0 nm to about 10.0 nm. In example 31, the device of any one of examples 25-30 can optionally include the conductive interconnect comprising copper, aluminum, tungsten, titanium, tantalum, silver, gold, palladium, platinum, zinc, nickel, or an alloy of two or more of the foregoing metals. In example 32, the device of any one of examples 25-31 can optionally include the first contact comprising copper, aluminum, tungsten, titanium, tantalum, silver, gold, palladium, platinum, zinc, nickel, or an alloy of two or more of the foregoing metals. In example 33, the device of any one of examples 25-32 can optionally include the second contact comprising copper, aluminum, tungsten, titanium, tantalum, silver, gold, palladium, platinum, zinc, nickel, or an alloy of two or more of the foregoing metals. In example 34, the device of any one of examples 25-33 can optionally include the first carrier-doped epitaxial layer comprising one of an n-type epitaxial layer or a p-type epitaxial layer. In example 35, the device of any one of examples 25-34 can optionally include the semiconductor film comprising silicon, germanium, an alloy of silicon and germanium, a III-V semiconductor compound, or a II-VI semiconductor compound, phosphorous and silicon, or boron and silicon. In example 36, the device of example 34 can optionally include the first carrier-doped epitaxial layer comprising one of a P-doped epitaxial layer, an As-doped epitaxial layer, a N-doped epitaxial layer; a B-doped epitaxial layer, or an Al-doped epitaxial layer.

Further, Example 37 is an electronic device, comprising: at least one semiconductor die having circuitry assembled therein, the circuitry comprising a plurality of transistors, at least one of the plurality of transistor comprising, a gate contact; a first composite spacer layer adjacent the gate contact, the first composite layer comprising a first dielectric layer and a second dielectric layer substantially parallel to the first dielectric layer; a first conductive interconnect assembled adjacent the second dielectric layer; a source contact assembled adjacent to the first composite spacer layer and forming a first interface with the first conductive interconnect; a first carrier-doped epitaxial layer forming a non-planar interface with the source contact; a second composite spacer layer adjacent the gate contact, the second composite spacer layer comprising a third dielectric layer and a fourth dielectric layer substantially parallel the third dielectric layer; a second conductive interconnect assembled adjacent the fourth dielectric layer; a drain contact assembled adjacent to the second composite spacer layer and forming a second interface with the second conductive interconnect; and a second carrier-doped epitaxial layer forming a non-planar interface with the drain contact. In example 38, the device of example 37 can optionally include the first dielectric layer comprising at least one of a silicon oxide or a high-k dielectric, and the second dielectric layer comprising at least one of silicon dioxide or a low-k material. In example 39, the device of any one of examples 37-38 can optionally include the third dielectric layer comprising at least one of a silicon oxide or a high-k dielectric, and the fourth dielectric layer comprising at least one of silicon dioxide or a low-k material. In example 40, the device of any one of examples 37-38 can optionally include the first dielectric layer having a first thickness in a first range from about 0.5 nm to about 10.0 nm, and the second dielectric layer having a second thickness in a second range from about 0.5 nm to about 10.0 nm. In example 41, the device of any one of examples 37, 38 or 40 can optionally include the third dielectric layer having a first thickness in a first range from about 0.5 nm to about 10.0 nm, the fourth dielectric layer having a second thickness in a second range from about 0.5 nm to about 10.0 nm.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

As used herein, the term "substantially" indicates that each of the described dimensions is not a strict boundary or parameter and does not exclude functionally similar variations therefrom. Unless context or the description indicates otherwise, the use of the term "substantially" in connection with a numerical parameter indicates that the numerical parameter includes variations that, using mathematical and industrial principles accepted in the art (e.g., rounding, measurement or other systematic errors, manufacturing tolerances, etc.), would not vary the least significant digit.

Further, certain relationships between dimensions of layers of a semiconductor device in accordance with this disclosure and between other elements of the semiconductor device are described herein using the term "substantially equal." As used herein, the term "substantially equal" indicates that the equal relationship is not a strict relationship and does not exclude functionally similar variations therefrom. Unless context or the description indicates otherwise, the use of the term "substantially equal" in connection with two or more described dimensions indicates that the equal relationship between the dimensions includes variations that, using mathematical and industrial principles accepted in the art (e.g., rounding, measurement or other systematic errors, manufacturing tolerances, etc.), would not vary the least significant digit of the dimensions. As used herein, the term "substantially constant" indicates that the constant relationship is not a strict relationship and does not exclude functionally similar variations therefrom.

As used herein, the term "substantially parallel" indicates that the parallel relationship is not a strict relationship and does not exclude functionally similar variations therefrom. As used herein the term "substantially perpendicular" indicates that the perpendicular relationship between two or more elements of a semiconductor device in accordance with this disclosure are not a strict relationship and does not exclude functionally similar variations therefrom.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of semiconductor devices having composite spacer layers and techniques for providing such devices. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. An integrated circuit structure, comprising:
    a fin comprising silicon;
    a source or drain region in the fin, the source or drain region comprising epitaxial silicon, and the source or drain region having a first source or drain interface with the fin and a second source or drain interface with the fin, the second source or drain interface with the fin opposite the first source or drain interface with the fin;
    a contact member on the source or drain region, the contact member having a top surface co-planar with a top of the fin, and the contact member having a curved bottom surface;
    a conductive interconnect on the contact member, the conductive interconnect having a first side and a second side, the second side opposite the first side;
    a first dielectric layer having a planar interface with the first side of the conductive interconnect, the first dielectric layer having a first composition, and the first dielectric layer having an upper surface;
    a second dielectric layer having a vertical interface with the first dielectric layer, the second dielectric layer having a second composition different than the first composition, and the second dielectric layer having an upper surface, wherein the first source or drain interface with the fin is laterally between the conductive interconnect and the vertical interface of the first and second dielectric layers;
    a first gate contact over the fin, the first gate contact having an upper surface co-planar with the upper surface of the first dielectric layer and co-planar with the upper surface of the second dielectric layer, wherein the second dielectric layer is between the first gate contact and the first dielectric layer;
    a third dielectric layer having a planar interface with the second side of the conductive interconnect, the third dielectric layer having the first composition, and the third dielectric layer having an upper surface;
    a fourth dielectric layer having a vertical interface with the third dielectric layer, the fourth dielectric layer having the second composition, and the fourth dielectric layer having an upper surface, wherein the second source or drain interface with the fin is laterally between the conductive interconnect and the vertical interface of the third and fourth dielectric layers; and
    a second gate contact over the fin, the second gate contact having an upper surface co-planar with the upper surface of the third dielectric layer and co-planar with the upper surface of the fourth dielectric layer, wherein the fourth dielectric layer is between the second gate contact and the third dielectric layer.

2. The integrated circuit structure of claim 1, wherein the contact member comprises a metal selected from the group consisting of copper, aluminum, tungsten, titanium, tantalum, silver, gold, palladium, platinum, zinc, and nickel.

3. The integrated circuit structure of claim 1, wherein the conductive interconnect comprises a metal selected from the group consisting of copper, aluminum, tungsten, titanium, tantalum, silver, gold, palladium, platinum, zinc, and nickel.

4. The integrated circuit structure of claim 1, further comprising:
    a first gate dielectric between the first gate contact and the fin; and
    a second gate dielectric between the second gate contact and the fin.

5. The integrated circuit structure of claim 4, wherein the first and second gate dielectrics comprise a high-k material.

6. The integrated circuit structure of claim 1, wherein the source or drain region is a p-type source or drain region.

7. The integrated circuit structure of claim 1, wherein the source or drain region is an n-type source or drain region.

8. A method of fabricating an integrated circuit structure, the method comprising:
    forming a fin comprising silicon;
    forming a source or drain region in the fin, the source or drain region comprising epitaxial silicon, and the source or drain region having a first source or drain interface with the fin and a second source or drain interface with the fin, the second source or drain interface with the fin opposite the first source or drain interface with the fin;
    forming a contact member on the source or drain region, the contact member having a top surface co-planar with a top of the fin, and the contact member having a curved bottom surface;
    forming a conductive interconnect on the contact member, the conductive interconnect having a first side and a second side, the second side opposite the first side;
    forming a first dielectric layer having a planar interface with the first side of the conductive interconnect, the first dielectric layer having a first composition, and the first dielectric layer having an upper surface;
    forming a second dielectric layer having a vertical interface with the first dielectric layer, the second dielectric layer having a second composition different than the first composition, and the second dielectric layer having an upper surface, wherein the first source or drain interface with the fin is laterally between the conductive interconnect and the vertical interface of the first and second dielectric layers;
    forming a first gate contact over the fin, the first gate contact having an upper surface co-planar with the upper surface of the first dielectric layer and co-planar with the upper surface of the second dielectric layer, wherein the second dielectric layer is between the first gate contact and the first dielectric layer;
    forming a third dielectric layer having a planar interface with the second side of the conductive interconnect, the third dielectric layer having the first composition, and the third dielectric layer having an upper surface;
    forming a fourth dielectric layer having a vertical interface with the third dielectric layer, the fourth dielectric layer having the second composition, and the fourth dielectric layer having an upper surface, wherein the second source or drain interface with the fin is laterally between the conductive interconnect and the vertical interface of the third and fourth dielectric layers; and
    forming a second gate contact over the fin, the second gate contact having an upper surface co-planar with the upper surface of the third dielectric layer and co-planar with the upper surface of the fourth dielectric layer, wherein the fourth dielectric layer is between the second gate contact and the third dielectric layer.

9. The method of claim 8, wherein the contact member comprises a metal selected from the group consisting of copper, aluminum, tungsten, titanium, tantalum, silver, gold, palladium, platinum, zinc, and nickel.

10. The method of claim 8, wherein the conductive interconnect comprises a metal selected from the group consisting of copper, aluminum, tungsten, titanium, tantalum, silver, gold, palladium, platinum, zinc, and nickel.

11. The method of claim 8, further comprising:
forming a first gate dielectric between the first gate contact and the fin; and
forming a second gate dielectric between the second gate contact and the fin.

12. The method of claim 11, wherein the first and second gate dielectrics comprise a high-k material.

13. The method of claim 8, wherein the source or drain region is a p-type source or drain region.

14. The method of claim 8, wherein the source or drain region is an n-type source or drain region.

15. A system, comprising:
a memory chip; and
a processor chip coupled to the memory chip, the processor chip comprising an integrated circuit structure, the integrated circuit structure comprising:
a fin comprising silicon;
a source or drain region in the fin, the source or drain region comprising epitaxial silicon, and the source or drain region having a first source or drain interface with the fin and a second source or drain interface with the fin, the second source or drain interface with the fin opposite the first source or drain interface with the fin;
a contact member on the source or drain region, the contact member having a top surface co-planar with a top of the fin, and the contact member having a curved bottom surface;
a conductive interconnect on the contact member, the conductive interconnect having a first side and a second side, the second side opposite the first side;
a first dielectric layer having a planar interface with the first side of the conductive interconnect, the first dielectric layer having a first composition, and the first dielectric layer having an upper surface;
a second dielectric layer having a vertical interface with the first dielectric layer, the second dielectric layer having a second composition different than the first composition, and the second dielectric layer having an upper surface, wherein the first source or drain interface with the fin is laterally between the conductive interconnect and the vertical interface of the first and second dielectric layers;
a first gate contact over the fin, the first gate contact having an upper surface co-planar with the upper surface of the first dielectric layer and co-planar with the upper surface of the second dielectric layer, wherein the second dielectric layer is between the first gate contact and the first dielectric layer;
a third dielectric layer having a planar interface with the second side of the conductive interconnect, the third dielectric layer having the first composition, and the third dielectric layer having an upper surface;
a fourth dielectric layer having a vertical interface with the third dielectric layer, the fourth dielectric layer having the second composition, and the fourth dielectric layer having an upper surface, wherein the second source or drain interface with the fin is laterally between the conductive interconnect and the vertical interface of the third and fourth dielectric layers; and
a second gate contact over the fin, the second gate contact having an upper surface co-planar with the upper surface of the third dielectric layer and co-planar with the upper surface of the fourth dielectric layer, wherein the fourth dielectric layer is between the second gate contact and the third dielectric layer.

16. The system of claim 15, further comprising:
a chipset coupled to the processor chip.

17. The system of claim 16, further comprising:
a display device coupled to the chipset.

18. The system of claim 16, further comprising:
a smart TV coupled to the chipset.

19. The system of claim 16, further comprising:
an I/O device coupled to the chipset.

20. The system of claim 16, further comprising:
a bus bridge coupled to the chipset.

* * * * *